(12) United States Patent
Yi et al.

(10) Patent No.: US 9,875,970 B2
(45) Date of Patent: Jan. 23, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Moon Hee Yi, Suwon-si (KR); Joo Hwan Jung, Suwon-si (KR); Yul Kyo Chung, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/413,713

(22) Filed: Jan. 24, 2017

(65) Prior Publication Data

US 2017/0309571 A1    Oct. 26, 2017

(30) Foreign Application Priority Data

Apr. 25, 2016   (KR) .................. 10-2016-0049830
Sep. 12, 2016   (KR) .................. 10-2016-0117321
Dec. 8, 2016    (KR) .................. 10-2016-0166951

(51) Int. Cl.
   *H01L 23/34*        (2006.01)
   *H01L 23/538*       (2006.01)
   (Continued)

(52) U.S. Cl.
   CPC ...... *H01L 23/5389* (2013.01); *H01L 23/3128* (2013.01); *H01L 23/3675* (2013.01);
   (Continued)

(58) Field of Classification Search
   CPC ............ H01L 23/3128; H01L 23/5389; H01L 23/5384; H01L 23/3675; H01L 23/5386; H01L 24/14; H01L 24/20
   (Continued)

(56) References Cited

U.S. PATENT DOCUMENTS 7,176,579 B2 *   2/2007   Konishi ............. H01L 23/3121
                                                     257/724
8,198,541 B2 *   6/2012   Sasaoka ............. H05K 1/0206
                                                     174/252
(Continued)

FOREIGN PATENT DOCUMENTS

JP      2013-211526 A    10/2013
KR   10-2009-0091333 A    8/2009

*Primary Examiner* — Luan C Thai
(74) *Attorney, Agent, or Firm* — McDermott Will & Emery LLP

(57) ABSTRACT

A fan-out semiconductor package includes: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; a pattern layer disposed on the encapsulant and covering at least portions of the encapsulant adjacent to the inactive surface of the semiconductor chip; vias penetrating through the encapsulant and connecting the pattern layer and the inactive surface of the semiconductor chip to each other; and a second connection member disposed on the first connection member and the active surface of the semiconductor chip and including a redistribution layer electrically connected to the connection pads of the semiconductor chip.

18 Claims, 22 Drawing Sheets

(51) Int. Cl.
*H01L 23/31* (2006.01)
*H01L 23/00* (2006.01)
*H01L 23/367* (2006.01)

(52) U.S. Cl.
CPC ...... *H01L 23/5384* (2013.01); *H01L 23/5386* (2013.01); *H01L 24/14* (2013.01); *H01L 24/20* (2013.01); *H01L 2224/0239* (2013.01); *H01L 2224/02311* (2013.01); *H01L 2224/02379* (2013.01); *H01L 2224/0401* (2013.01); *H01L 2224/05124* (2013.01); *H01L 2224/13023* (2013.01); *H01L 2224/13024* (2013.01); *H01L 2224/13111* (2013.01); *H01L 2224/13139* (2013.01); *H01L 2224/13147* (2013.01); *H01L 2224/14131* (2013.01); *H01L 2224/14177* (2013.01); *H01L 2224/19* (2013.01); *H01L 2224/215* (2013.01); *H01L 2924/014* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/0665* (2013.01); *H01L 2924/07025* (2013.01); *H01L 2924/10252* (2013.01); *H01L 2924/10253* (2013.01); *H01L 2924/10329* (2013.01); *H01L 2924/14* (2013.01); *H01L 2924/1579* (2013.01); *H01L 2924/186* (2013.01); *H01L 2924/19105* (2013.01); *H01L 2924/3025* (2013.01)

(58) Field of Classification Search
USPC .......................................................... 257/712
See application file for complete search history.

(56) References Cited

U.S. PATENT DOCUMENTS

| 9,282,628 | B2* | 3/2016 | Okamoto | H05K 1/0206 |
| 2008/0157358 | A1* | 7/2008 | Yang | H01L 23/5389 |
| | | | | 257/737 |
| 2010/0025082 | A1 | 2/2010 | Sasaoka et al. | |
| 2014/0202741 | A1 | 7/2014 | Okamoto | |

* cited by examiner

II-II'

FAN-OUT SEMICONDUCTOR PACKAGE

CROSS-REFERENCE TO RELATED APPLICATION(S)

This application claims benefit of priority to Korean Patent Application Nos. 10-2016-0049830 filed on Apr. 25, 2016, 10-2016-0117321 filed on Sep. 12, 2016 and 10-2016-0166951 filed on Dec. 8, 2016 in the Korean Intellectual Property Office, the disclosures of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which heat generated by a semiconductor chip may be effectively dissipated by a simple process.

According to an aspect of the present disclosure, a fan-out semiconductor package may be provided, in which a pattern layer is formed on an encapsulant encapsulating a semiconductor chip and is connected to an inactive surface of the semiconductor chip by vias penetrating through the encapsulant.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; a pattern layer disposed on the encapsulant and covering at least portions of the encapsulant adjacent to the inactive surface of the semiconductor chip; vias penetrating through the encapsulant and connecting the pattern layer and the inactive surface of the semiconductor chip to each other; and a second connection member disposed on the first connection member and the active surface of the semiconductor chip and including a redistribution layer electrically connected to the connection pads of the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to e a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
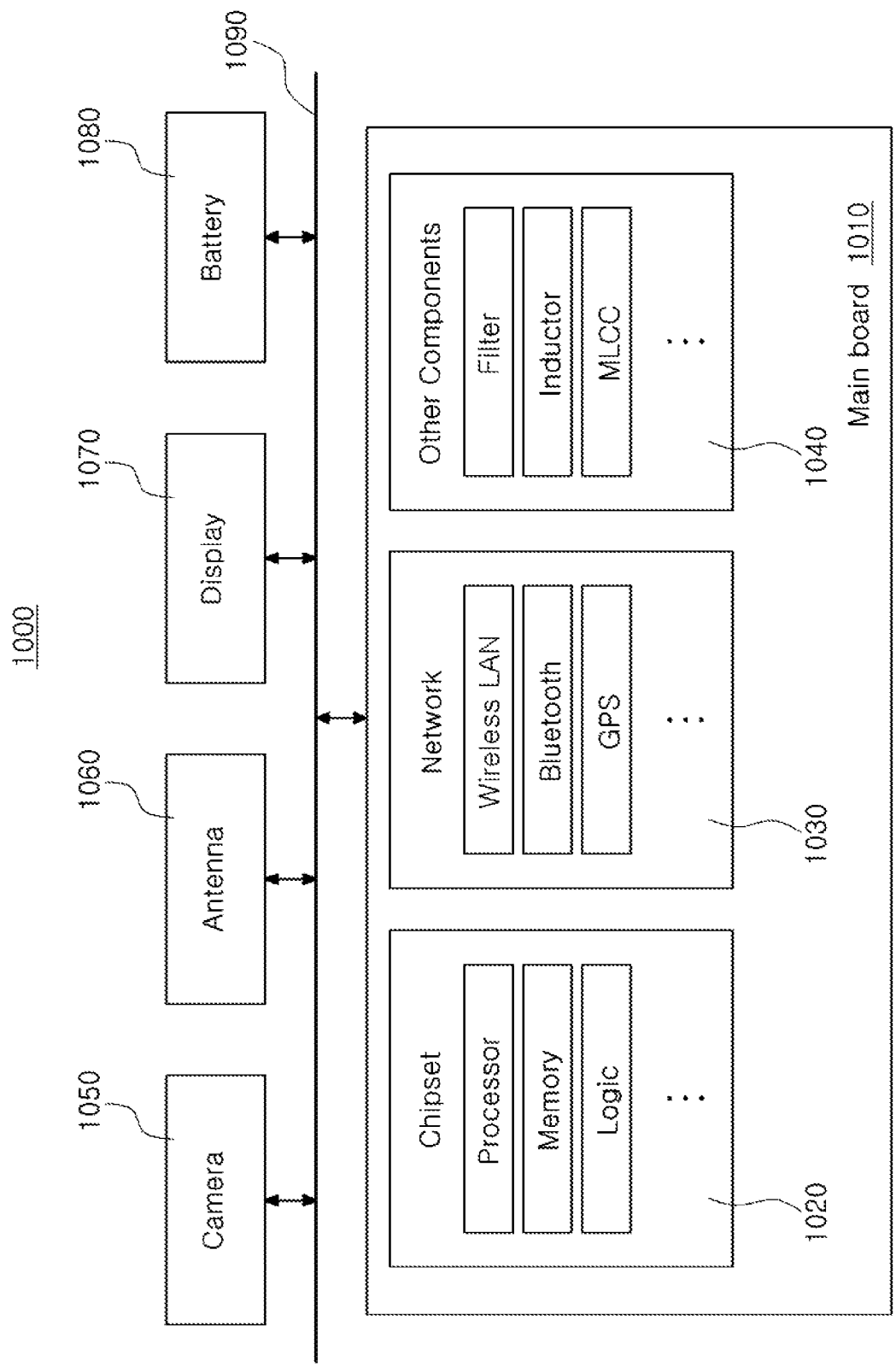
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
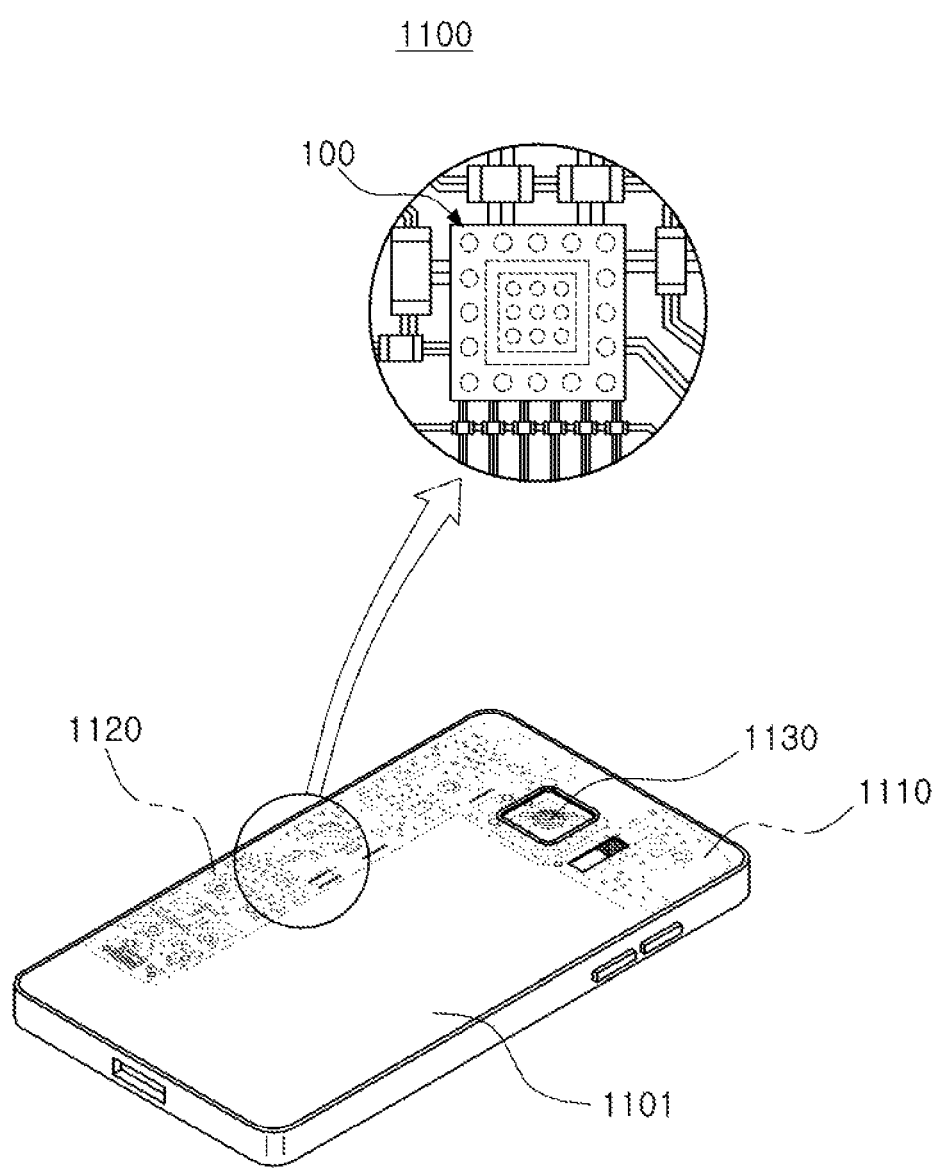
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
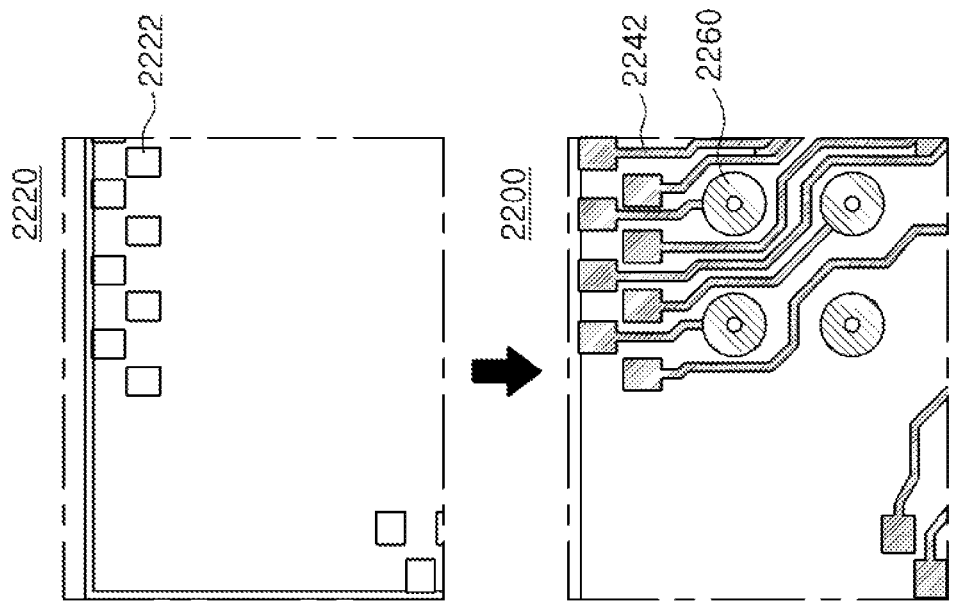
FIGS. 3A and 3B are schematic cross-sectional views illustrating states of a fan-in semiconductor package before and after being packaged.
Figure 3A:
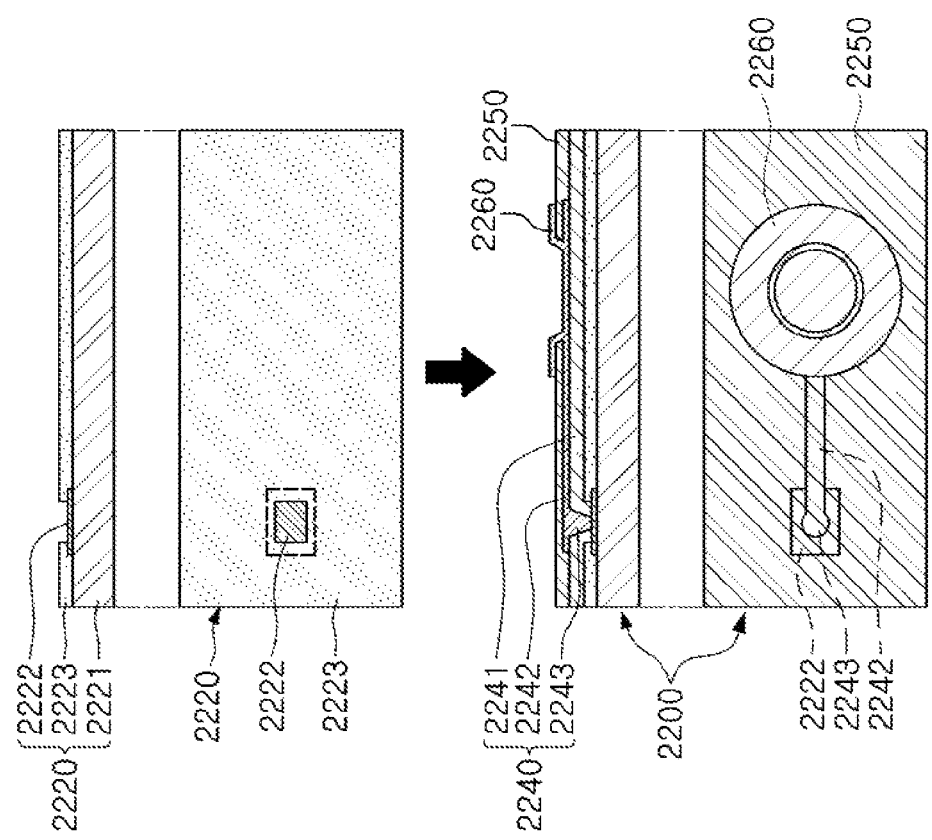

FIGS. 3A and 3B are schematic cross-sectional views illustrating states of a fan-in semiconductor package before and after being packaged.

Figure 4:
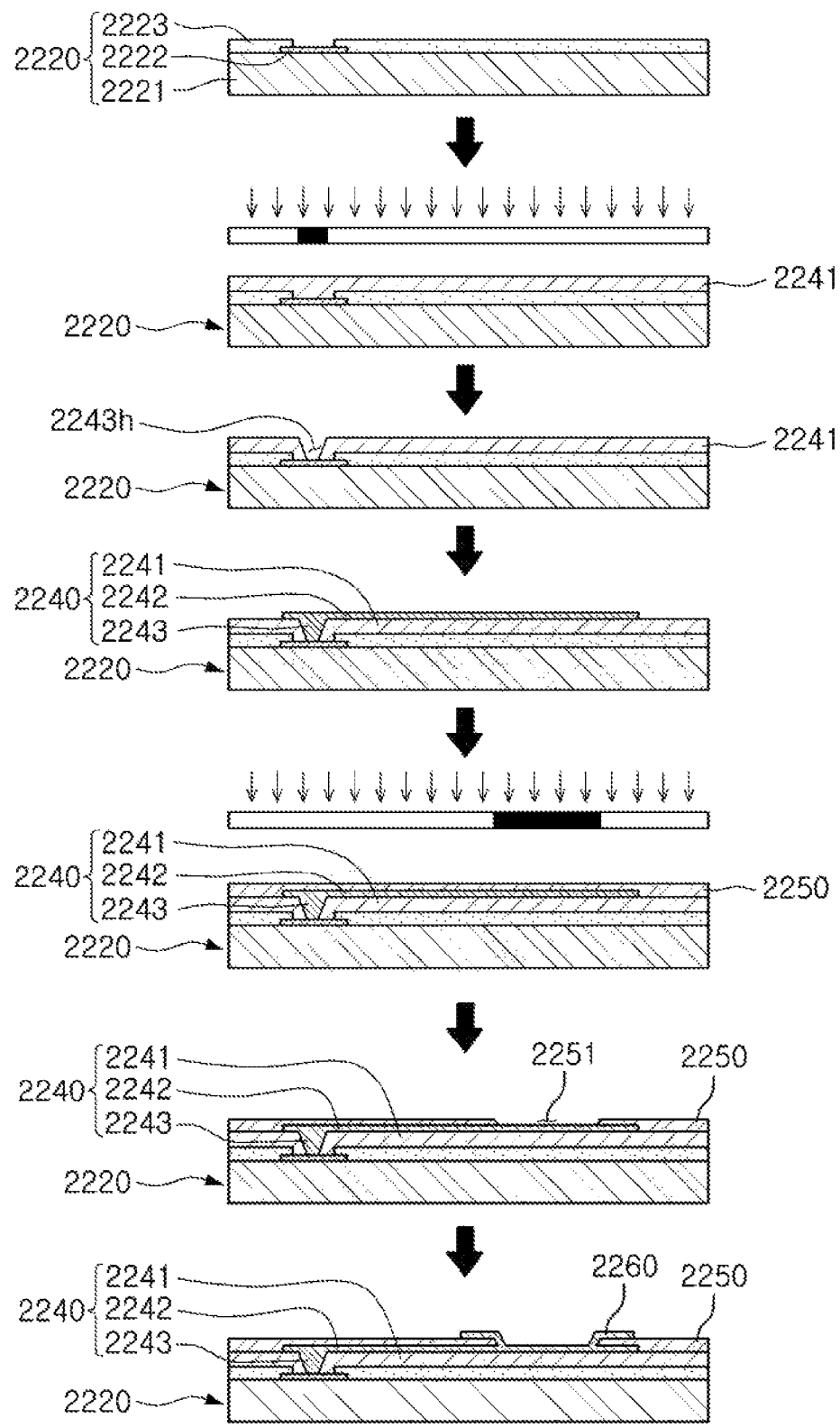
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
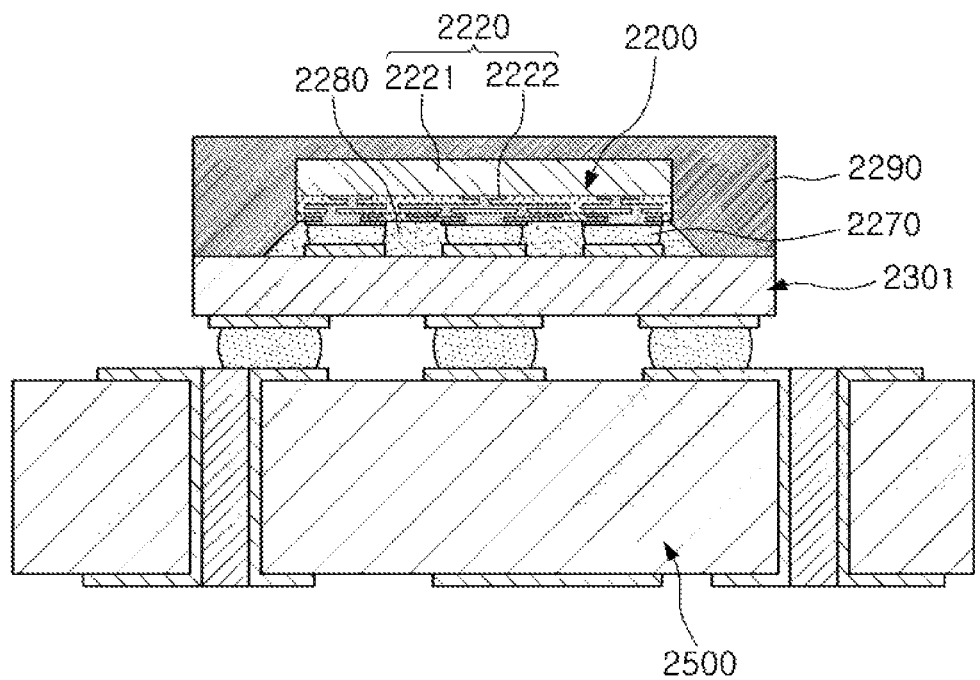
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
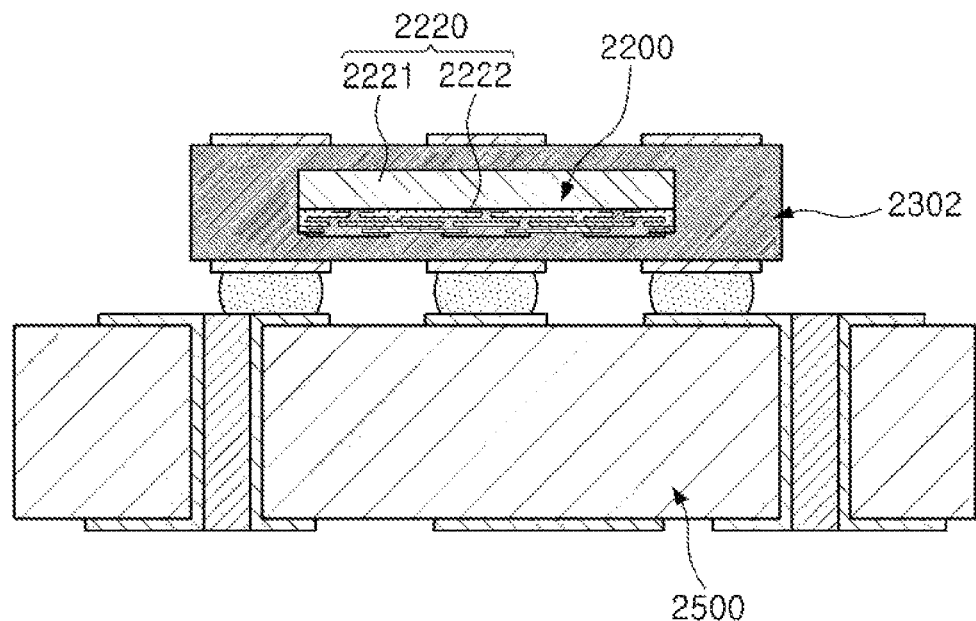
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
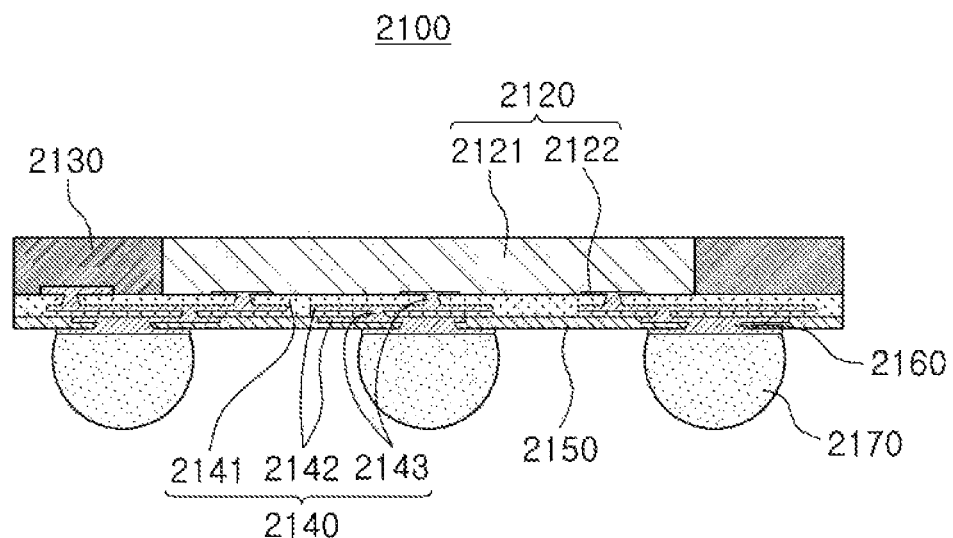
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an under-bump metal layer 2160 may be further formed in openings of the passivation layer 2150. Solder balls 2170 may be further formed on the under-bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
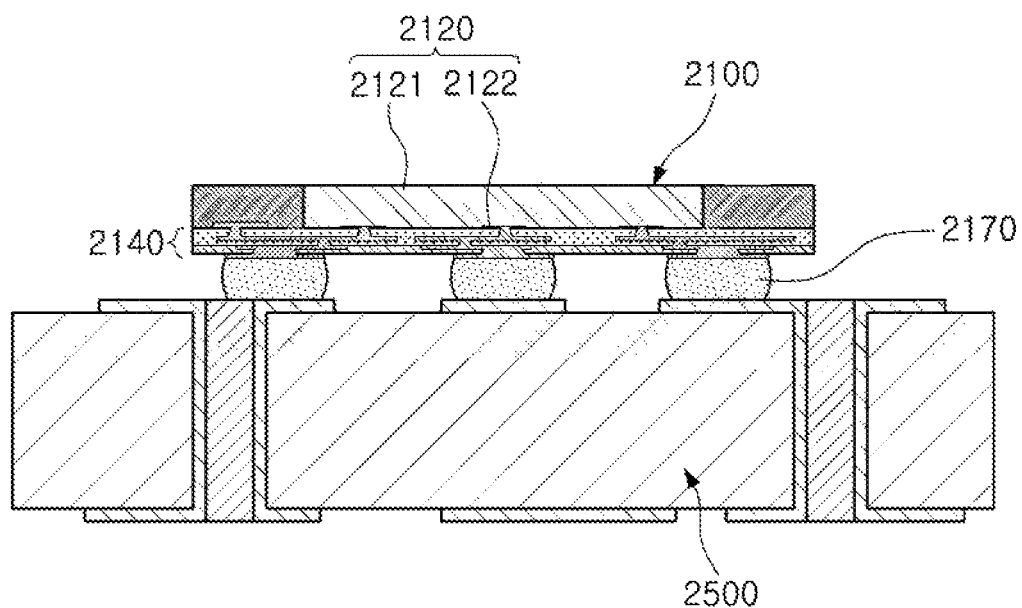
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which heat generated by a semiconductor chip may be effectively dissipated will hereinafter be described with reference to the drawings.

Figure 9:
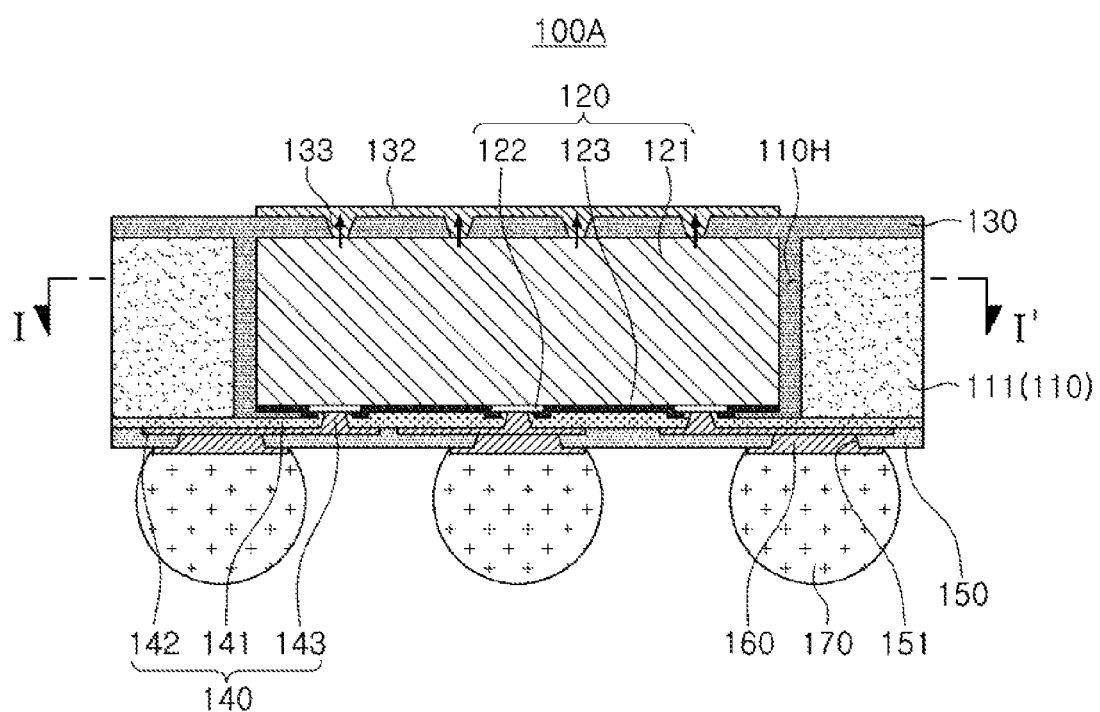
FIG. 9 is a schematic cross-sectional view illustrating an example of a fan-out semiconductor package.

FIG. 9 is a schematic cross-sectional view illustrating an example of a fan-out semiconductor package.

Figure 10:
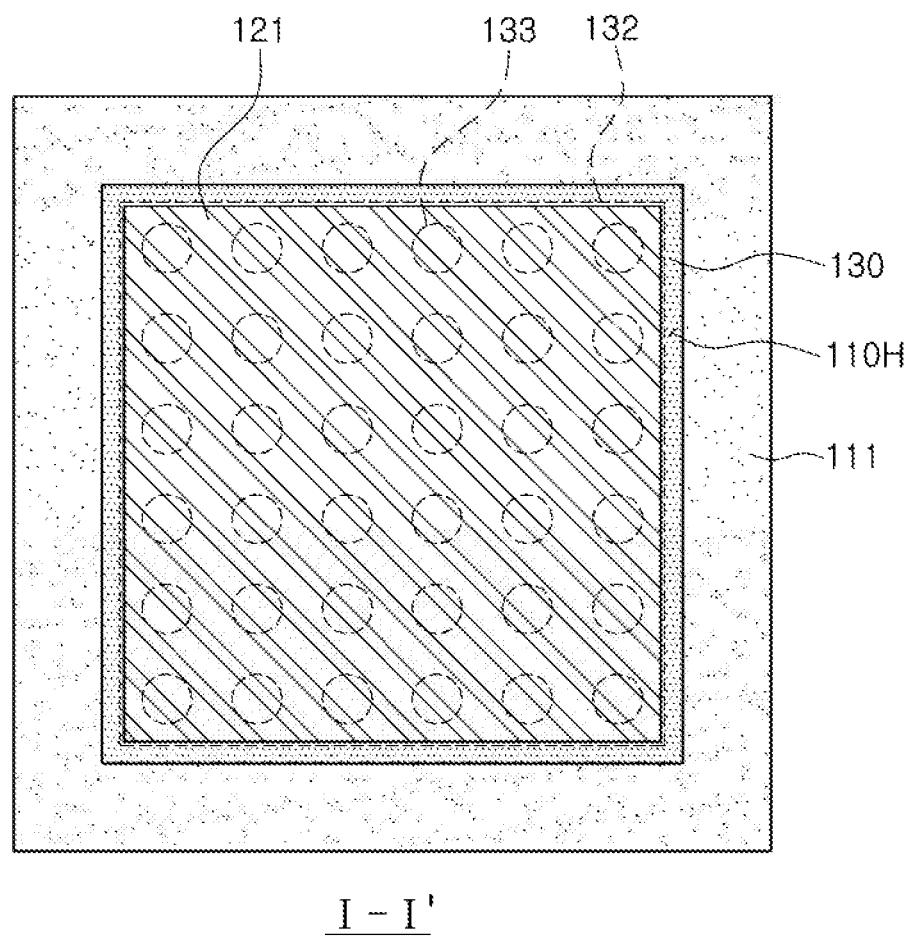
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, an encapsulant 130 encapsulating at least portions of the first connection member 110 and the inactive surface of the semiconductor chip 120, a second connection member 140 disposed on the first connection member 110 and the active surface of the semiconductor chip 120, a passivation layer 150 disposed on the second connection member 140, an under-bump metal layer 160 formed in openings 151 of the passivation layer 150, and connection terminals 170 formed on the under-bump metal layer 160. A pattern layer 132 covering at least portions of the encapsulant 130 adjacent to the inactive surface of the semiconductor chip 120 may be disposed on the encapsulant 130, and may be connected to the inactive surface of the semiconductor chip 120 by vias 133 penetrating through the encapsulant 130. Heat (represented by arrows) generated by the semiconductor chip 120 may be easily dissipated externally through the vias 133 and the pattern layer 132.

A general fan-out semiconductor package has a structure in which a semiconductor chip is simply molded with and surrounded by an encapsulant such as an epoxy molding compound (EMC), or the like. In this case, most heat generated by the semiconductor chip is discharged downwardly along redistribution layers, and only a significantly small amount of heat is conducted to the encapsulant having low thermal conductivity, such that heat dissipation characteristics are deteriorated.

On the other hand, in a case in which the pattern layer 132 connected to the inactive surface of the semiconductor chip 120 and the vias 133 are disposed in a location adjacent to the inactive surface of the semiconductor chip 120 as in the fan-out semiconductor package 100A according to the exemplary embodiment, heat (represented by the arrows) generated by the semiconductor chip 120 may be easily dissipated, such that heat dissipation characteristics may be improved. In addition, the pattern layer 132 may solve electromagnetic interference (EMI).

Meanwhile, since the inactive surface of the semiconductor package 120 is connected to the pattern layer 132 through the vias 133, in a case in which the fan-out semiconductor package 100A includes a plurality of semiconductor chips 120, the vias 133 may be selectively connected only to certain semiconductor chips 120 generating a large amount of heat or may only be intensively formed in generating a large amount of heat among the semiconductor chips 120. In addition, the vias 133 and the pattern layer 132 may be simultaneously formed using the same material and integrated with each other without a boundary therebetween. Therefore, a process of forming the vias 133 and the pattern layer 132 may be simple, and reliability of a connection between the vias 133 and the pattern layer 132 may be excellent.

The respective components included in the fan-out semiconductor package 100A according to the exemplary embodiment will hereinafter be described below in more detail.

The first connection member 110 may maintain rigidity of the fan-out semiconductor package 100A depending on certain materials, and serve to secure uniformity of a thickness of the encapsulant 130. The first connection member 110 may have the through-hole 110H. The through-hole 110H may have the semiconductor chip 120 disposed therein to be spaced apart from the first connection member 110 by a predetermined distance. Side surfaces of the semiconductor chip 120 may be surrounded by the first connection member 110. However, such a form is only an example and may be variously modified to have other forms, and the fan-out semiconductor package 100A may perform another function depending on such a form.

The first connection member 110 may include an insulating layer 111. A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pads 122 may have a step with respect to a lower surface of the encapsulant 130 through the passivation layer 123. Therefore, bleeding of the encapsulant 130 may be improved. An insulating layer (not illustrated), and the like, may also be further disposed in other required positions.

The encapsulant 130 may protect the first connection member 110 and/or the semiconductor chip 120. An encapsulation form of the encapsulant 130 is not particularly limited, but may be a form in which the encapsulant 130 surrounds at least portions of the first connection member 110 and/or the semiconductor chip 120. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

The certain materials of the encapsulant 130 are not particularly limited. For example, an insulating material may be used as the material of the encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, EMC, or the like. Alternatively, a material in which a thermosetting resin or a thermoplastic resin is impregnated together with an inorganic filler in a core material such as a glass fabric may also be used as the insulating material. Alternatively, a photoimagable dielectric (PID) resin may also be used as the insulating material.

The pattern layer 132 may be formed on the surface of the encapsulant 130. The pattern layer 132 may be a metal layer including a known conductive material. For example, the pattern layer 132 may include copper (Cu), aluminum (Al), silver (Ag), tin (Sn), gold (Au), nickel (Ni), lead (Pb), titanium (Ti), or alloys thereof. The pattern layer 132 may be formed together with the vias 133 by the known plating method. The pattern layer 132 may be patterns electrically insulated from the connection pads 122 of the semiconductor chip 120, that is, heat dissipation patterns, but is not limited thereto. That is, the pattern layer 132 may be electrically connected to the connection pads 122 of the semiconductor chip 120 while being the heat dissipation patterns in a case of performing a ground (GND) function, if necessary.

The vias 133 may be formed in via holes formed in the encapsulant 130. The via holes may penetrate from one surface of the encapsulant 130 to the inactive surface of the semiconductor chip 120. Therefore, the vias 133 may contact the inactive surface of the semiconductor chip 120. The via holes may be laser drilled via holes or photo-etched via holes depending on a material of the encapsulant 130. For example, the via holes may be the laser drilled via holes formed using a known laser drilling method in a case in which the encapsulant 130 is ABF including an inorganic filler and an insulating resin, and may be photo-etched via holes formed by a known photolithography method in a case in which the encapsulant 130 includes a photosensitive insulating material. The vias 133 may include a conductive material such as copper (Cu), aluminum (Al), silver (Ag), tin (Sn), gold (Au), nickel (Ni), lead (Pb), titanium (Ti), or alloys thereof, and may be formed together with the pattern layer 132 by a plating method.

In a case in which the pattern layer 132 and the vias 133 are formed together by the plating method, the pattern layer 132 and the vias 133 may be integrated with each other, and may not have a boundary therebetween. In addition, the pattern layer 132 and the vias 133 may include the same conductive material such as copper (Cu). That is, a separate adhesive material may not be required between the pattern layer 132 and the vias 133. Therefore, a process may be simple, and a heat dissipation member may be implemented to have a lower thickness. In a case in which the pattern layer 132 and the vias 133 are integrated with each other without the boundary therebetween to directly contact each other, the heat dissipated through the inactive surface of the semiconductor chip 120 may be more effectively dissipated outwardly.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through connection terminals 170 to be described below depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a single layer, but may also include a plurality of layers.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

Surface treatment layers (not illustrated) may be formed on a surface of the exposed redistribution layer 142, if necessary. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with the conductive material, or the conductive material may also be formed along a wall of the via. In addition, the via 143 may have all shapes known in the related art, such as a tapered shape, a cylindrical shape, and the like.

The passivation layer 150 may be additionally configured to protect the second connection member 140 from external physical or chemical damage. The passivation layer 150 may have the openings 151 exposing at least portions of the redistribution layer 142 of the second connection member 140. A material having a modulus of elasticity greater than that of the insulating layer 141 of the second connection member 140 may be used as a material of the passivation layer 150. For example, ABF that does not include a glass fiber, but includes an inorganic filler and an insulating resin may be used as the material of the passivation layer 150. When the ABF is used as the material of the passivation layer 150, a weight percentage of the inorganic filler included in the passivation layer 150 may be greater than that of the inorganic filler included in the insulating layer 141 of the second connection member 140 in order to improve reliability.

The under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second connection member 140 exposed through the openings 151 of the passivation layer 150. The under-bump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extending onto one surface of the passivation layer 150, and connection reliability may be more excellent.

At least one of the connection terminals 170 may be disposed in a fan-out region. The fan-out region is a region except for the region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
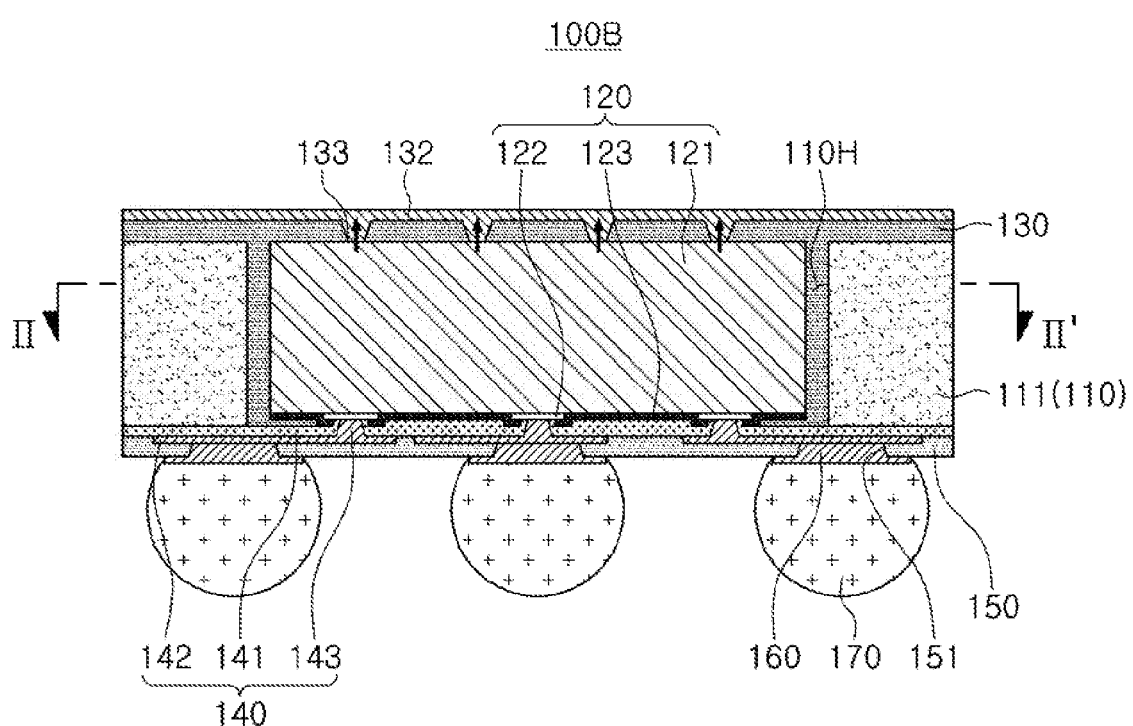
FIG. 11 is a schematic cross-sectional view illustrating another example of a fan-out semiconductor package.

FIG. 11 is a schematic cross-sectional view illustrating another example of a fan-out semiconductor package.

Figure 12:
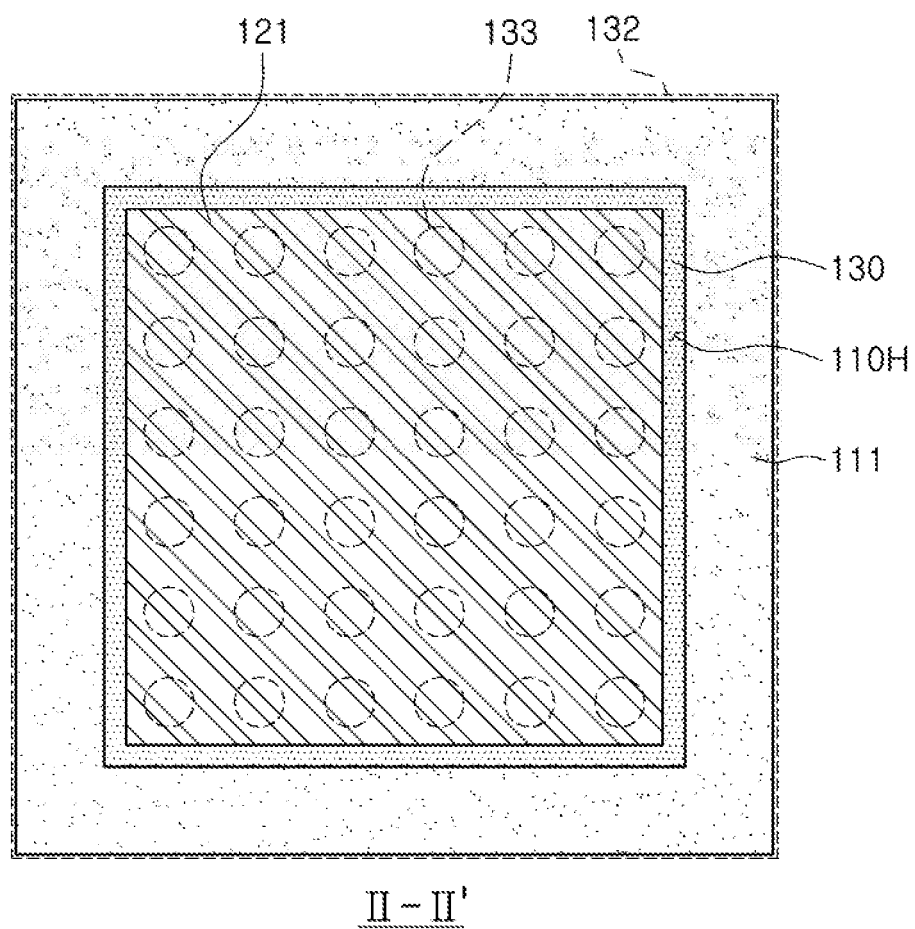
FIG. 12 is a schematic plan view taken along line II-II' of the fan-out semiconductor package of FIG. 11.

FIG. 12 is a schematic plan view taken along line II-II' of the fan-out semiconductor package of FIG. 11.

Referring to the drawings, in a fan-out semiconductor package 100B according to another exemplary embodiment, a pattern layer 132 may extend to a region of an encapsulant 130 covering a first connection member 110. For example, the pattern layer 132 may cover an entire surface of the encapsulant 130. Other contents overlap those described above, and a detailed description thereof is thus omitted.

Figure 13:
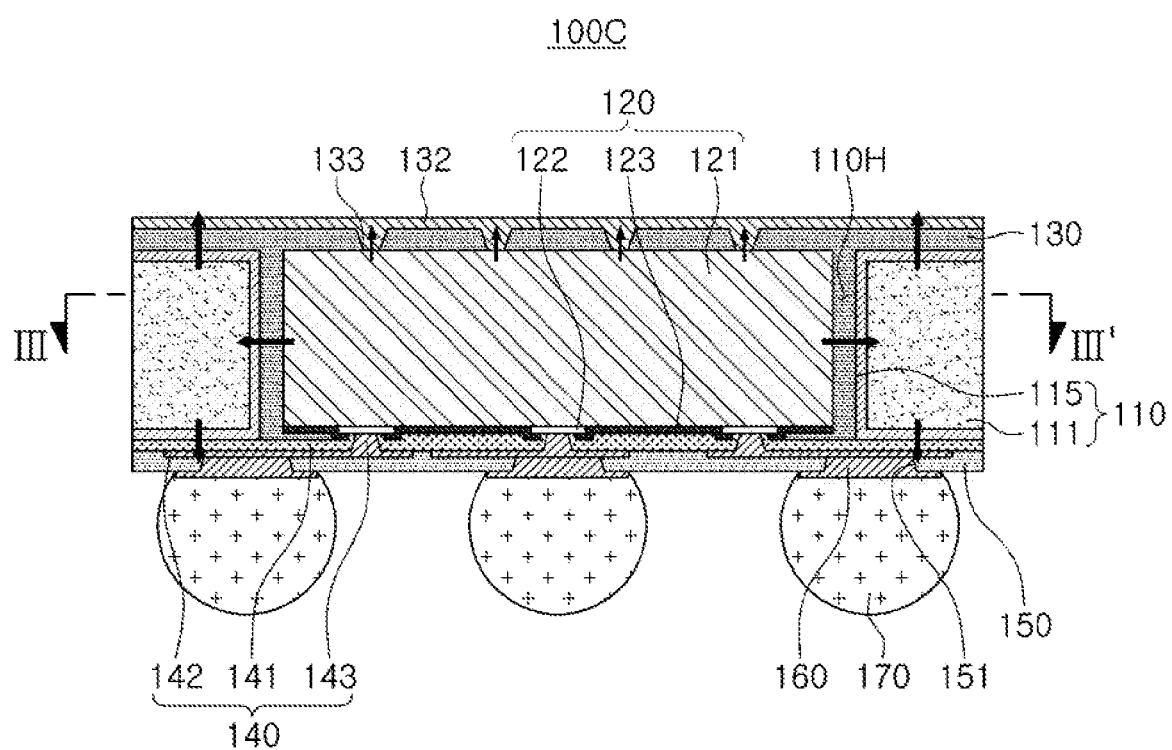
FIG. 13 is a schematic cross-sectional view illustrating another example of a fan-out semiconductor package.

FIG. 13 is a schematic cross-sectional view illustrating another example of a fan-out semiconductor package.

Figure 14:
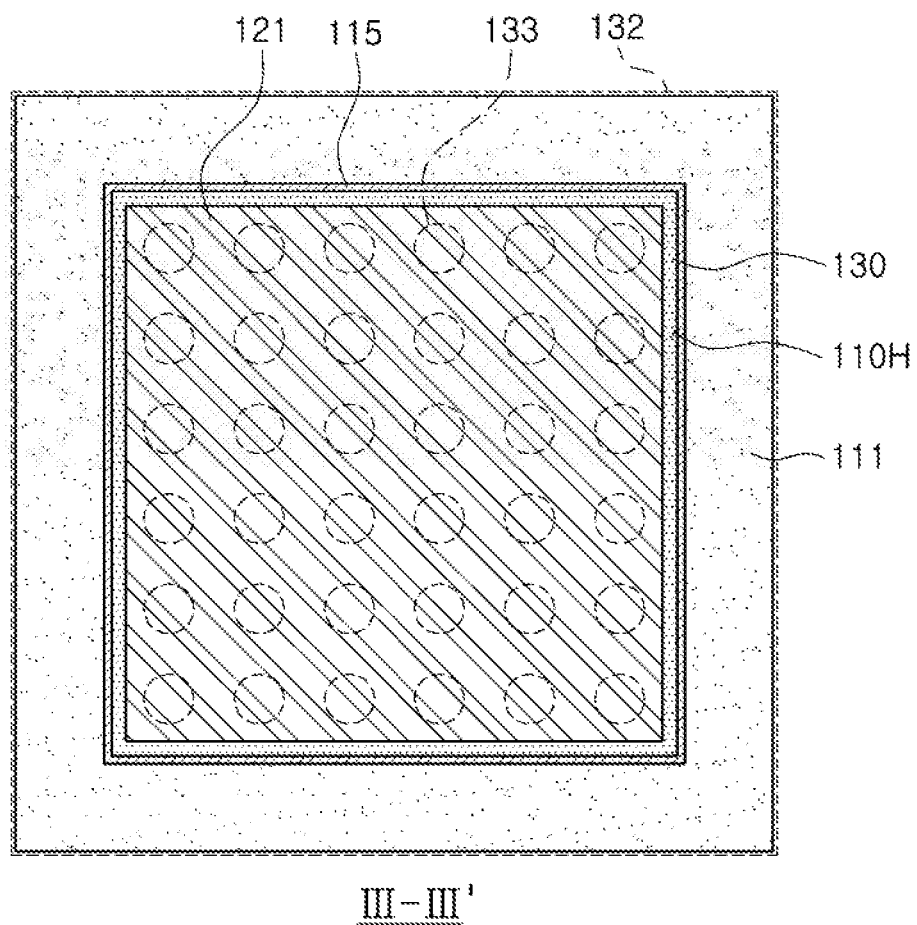
FIG. 14 is a schematic plan view taken along line III-III' of the fan-out semiconductor package of FIG. 13.

FIG. 14 is a schematic plan view taken along line III-III' of the fan-out semiconductor package of FIG. 13.

Referring to the drawing, in a fan-out semiconductor package 100C according to another exemplary embodiment in the present disclosure, a first connection member 110 may further include a metal layer 115 disposed on a wall of a through-hole 110H. The metal layer 115 may extend to an upper portion and a lower portion of an insulating layer 111, but is not limited thereto. Heat (represented by arrows) generated by a semiconductor chip 120 may move toward a first connection member 110 and be then dissipated upwardly and downwardly of the first connection member 110, through the metal layer 115. In addition, electromagnetic waves may be more effectively blocked. The metal layer 115 may also be formed by the known plating method, and may include the known conductive material. Other contents overlap those described above, and a detailed description thereof is thus omitted.

Figure 15:
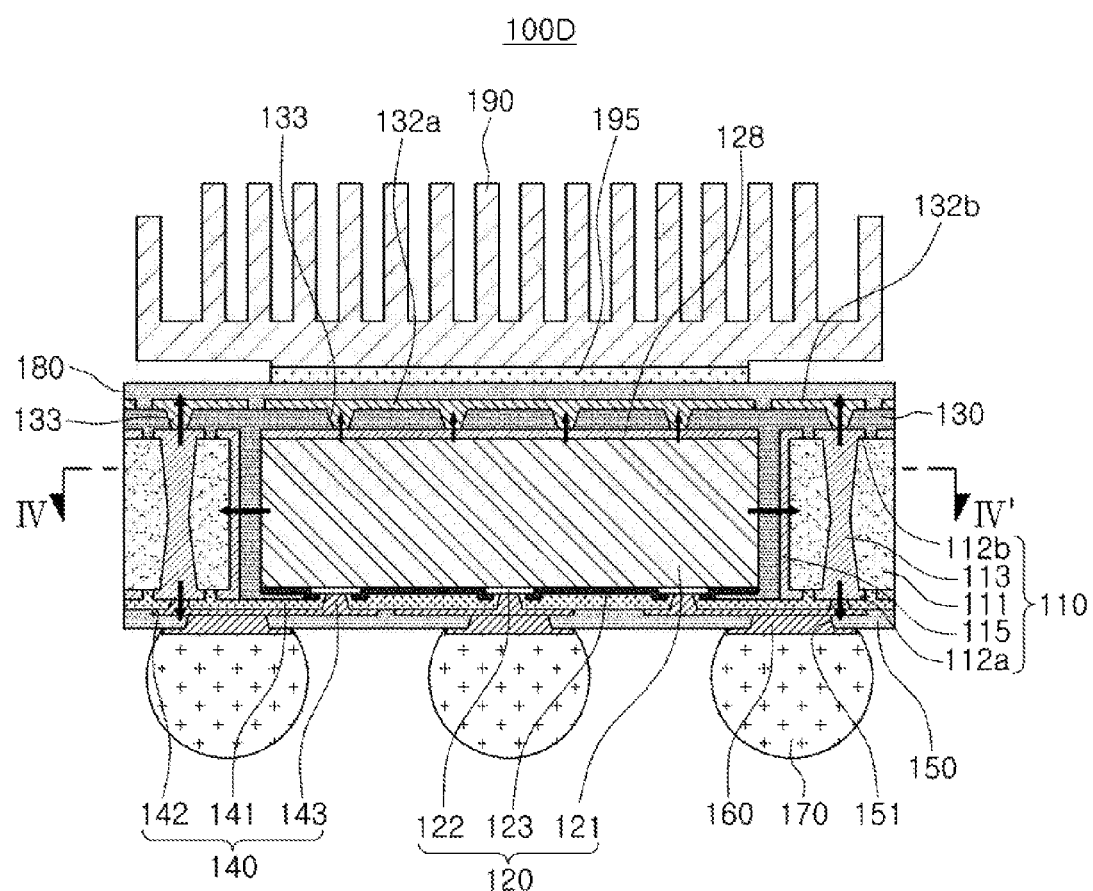
FIG. 15 is a schematic cross-sectional view illustrating another example of a fan-out semiconductor package.

FIG. 15 is a schematic cross-sectional view illustrating another example of a fan-out semiconductor package.

Figure 16:
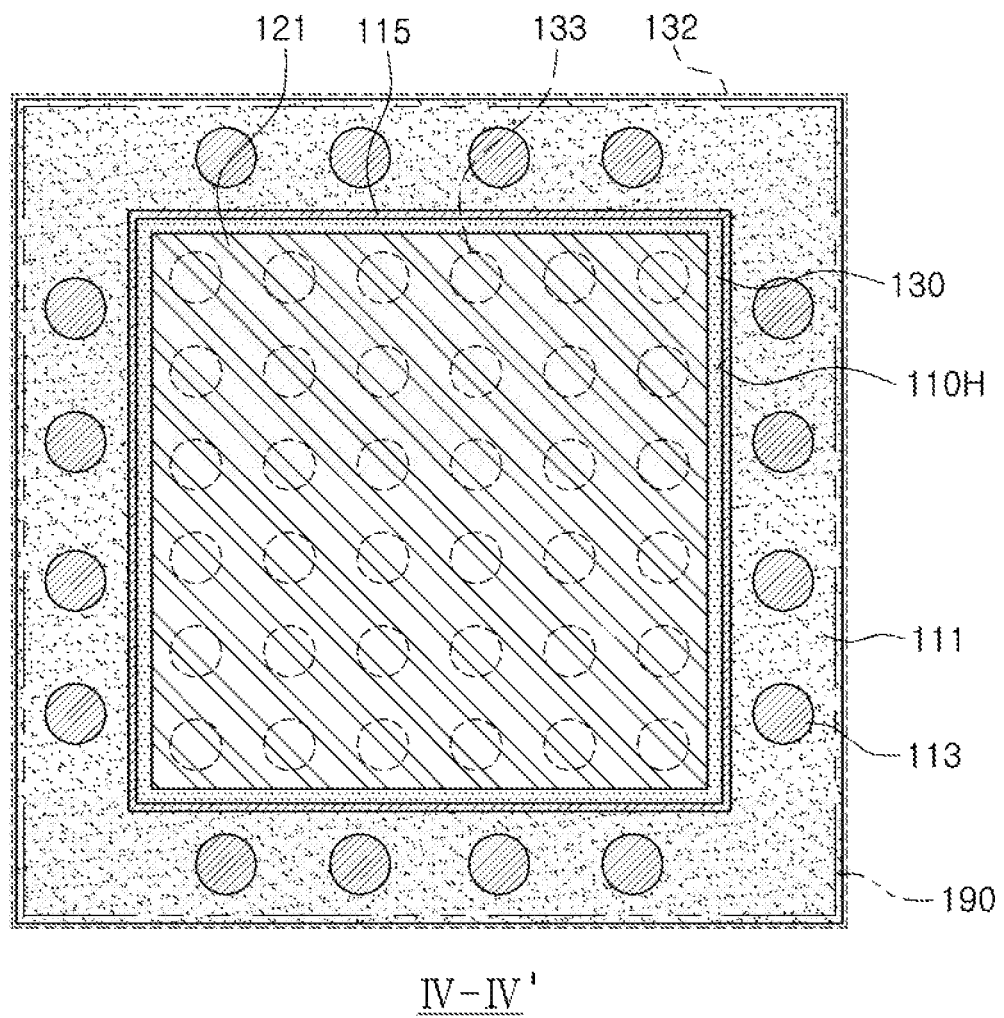
FIG. 16 is a schematic plan view taken along line IV-IV' of the fan-out semiconductor package of FIG. 15.

FIG. 16 is a schematic plan view taken along line IV-IV' of the fan-out semiconductor package of FIG. 15.

Referring to the drawings, in a fan-out semiconductor package 100D according to another exemplary embodiment, a metal layer 128 may be disposed on an inactive surface of a semiconductor chip 120, and vias 133 may be connected to the metal layer 128. In addition, pattern layers 132a and 132b may include heat dissipation patterns 132a covering at least portions of an encapsulant 130 adjacent to the inactive surface of the semiconductor chip 120, and may include wiring patterns 132b redistributing connection pads 122, or the like, of the semiconductor chip 120. In this case, the heat dissipation patterns 132a and the wiring patterns 132b may be disconnected from each other on the encapsulant 130. In addition, a first connection member 110 may include redistribution layers 112a and 112b disposed, respectively, on upper and lower surfaces of an insulating layer 111 to be disconnected from a metal layer 115, and the redistribution layers 112a and 112b may be electrically connected to each other by vias 113 penetrating through the insulating layer 111. In addition, a passivation layer 180 covering at least portions of the pattern layers 132a and 132b may be disposed on the encapsulant 130, and a heat dissipation member 190 may be attached to the passivation layer 180. Meanwhile, the heat dissipation member 190 may be attached directly to the passivation layer 180 or may be attached to the passivation layer 180 through a connection member 195 in order to improve reliability.

The metal layer 128 may serve to more effectively dissipate heat generated by the semiconductor chip 120 or more effectively block electromagnetic waves, and may be formed on the inactive surface of the semiconductor chip 120. The metal layer 128 may have a plate shape and may cover the entirety of the inactive surface of the semiconductor chip 120, but is not necessarily limited thereto. The metal layer 128 may also be formed by the known plating method, and may include a conductive material such as copper (Cu), or the like. The vias 133 may be connected to the metal layer 128 to thus be connected to the inactive surface of the semiconductor chip 120.

The heat dissipation patterns 132a may cover regions in which the wiring patterns 132b are not disposed on the encapsulant 130. The heat dissipation patterns 132a may have a plate shape, but are not limited thereto. The heat dissipation patterns 132a may be connected to the metal layer 115 formed in the first connection member 110 through the vias 133. The heat dissipation patterns 132a and the metal layer 115 may perform a ground (GND) function, if necessary. In this case, the heat dissipation patterns 132a and the metal layer 115 may be electrically connected to connection pads for a ground among the connection pads 122 of the semiconductor chip 120 through patterns or vias for a ground of redistribution layers formed in the first connection member 110 and a second connection member 140. That is, the pattern layers 132a and 132b may include ground patterns.

The wiring patterns 132b may be various kinds of redistribution patterns for redistributing the connection pads 122 of the semiconductor chip 120. In a case in which the heat dissipation patterns 132a perform a ground function, the wiring patterns 132b may include power patterns and signal patterns except for the ground patterns. That is, the pattern layers 132a and 132b may include power patterns and signal patterns. The wiring patterns 132b may be electrically connected to the redistribution layers 112a and 112b and the vias 113 of the first connection member 110 through the vias 133. In addition, the wiring patterns 132b may also be electrically connected to a redistribution layer 142 and vias 143 of the second connection member 140 through the first connection member 110. The wiring patterns 132b may also be electrically connected to the connection pads 122 of the semiconductor chip 120 through the path described above. The wiring patterns 132b may also include various kinds of pad patterns.

The redistribution layers 112a and 112b may serve to redistribute the connection pads 122. In a case in which the first connection member 110 includes the redistribution layers 112a and 112b as described above, the number of layers of the second connection member 140 may be reduced, such that a degree of design freedom may be increased and thinning of the second connection member 140 is possible. The redistribution layers 112a and 112b may perform various functions depending on designs of corresponding layers. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like.

The vias 113 may electrically connect the redistribution layers 112a and 112b formed on different layers to each other. The via 113 may be completely filled with the conductive material, or the conductive material may also be formed along a wall of the via. In addition, the via 113 may have all shapes known in the related art, such as a cylindrical shape, an hourglass shape, and the like.

The passivation layer 180 may include a material that is the same as or similar to that of the passivation layer 150 described above. In this case, warpage of the fan-out semiconductor package 100D may be suppressed through a symmetry effect of the passivation layers 150 and 180 disposed on both sides of the fan-out semiconductor package 100D. However, a material of the passivation layer 180 is not limited thereto, but may be another material. For example, prepreg including a core material such as a glass fabric, or the like, may be used as the material of the passivation layer 180. Meanwhile, a weight percentage of an inorganic filler included in the passivation layer 180 may be greater than that of an inorganic filler included in the encapsulant 130 in order to suppress warpage. The passivation layer 180 may also be attached to the encapsulant 130 before it is hardened. In this case, a dimple toward a through-hole 110H may be formed due to movement of the inorganic filler caused by the hardening.

The heat dissipation member 190 may be the known heat sink. The heat dissipation member 190 may easily dissipate heat dissipated through the heat dissipation patterns 132a of the pattern layers 132a and 132b externally of the fan-out semiconductor package 100A. The heat dissipation member 190 may have a plurality of trenches formed in an upper surface thereof in order to easily dissipate heat. In this case, a surface area may be increased to easily dissipate heat. A material of the heat dissipation member 190 is not particularly limited as long as it has excellent thermal conductivity. For example, the heat dissipation member 190 may include a metal. The connection member 195 may allow the heat dissipation member 190 to be easily attached to the passivation layer 180, and may prevent electrical short-circuits and efficiently transfer heat, if necessary. A material of the connection member 195 may be appropriately selected depending on a material of the heat dissipation member 190.

Other contents overlap those described above, and a detailed description thereof is thus omitted.

Figure 17:
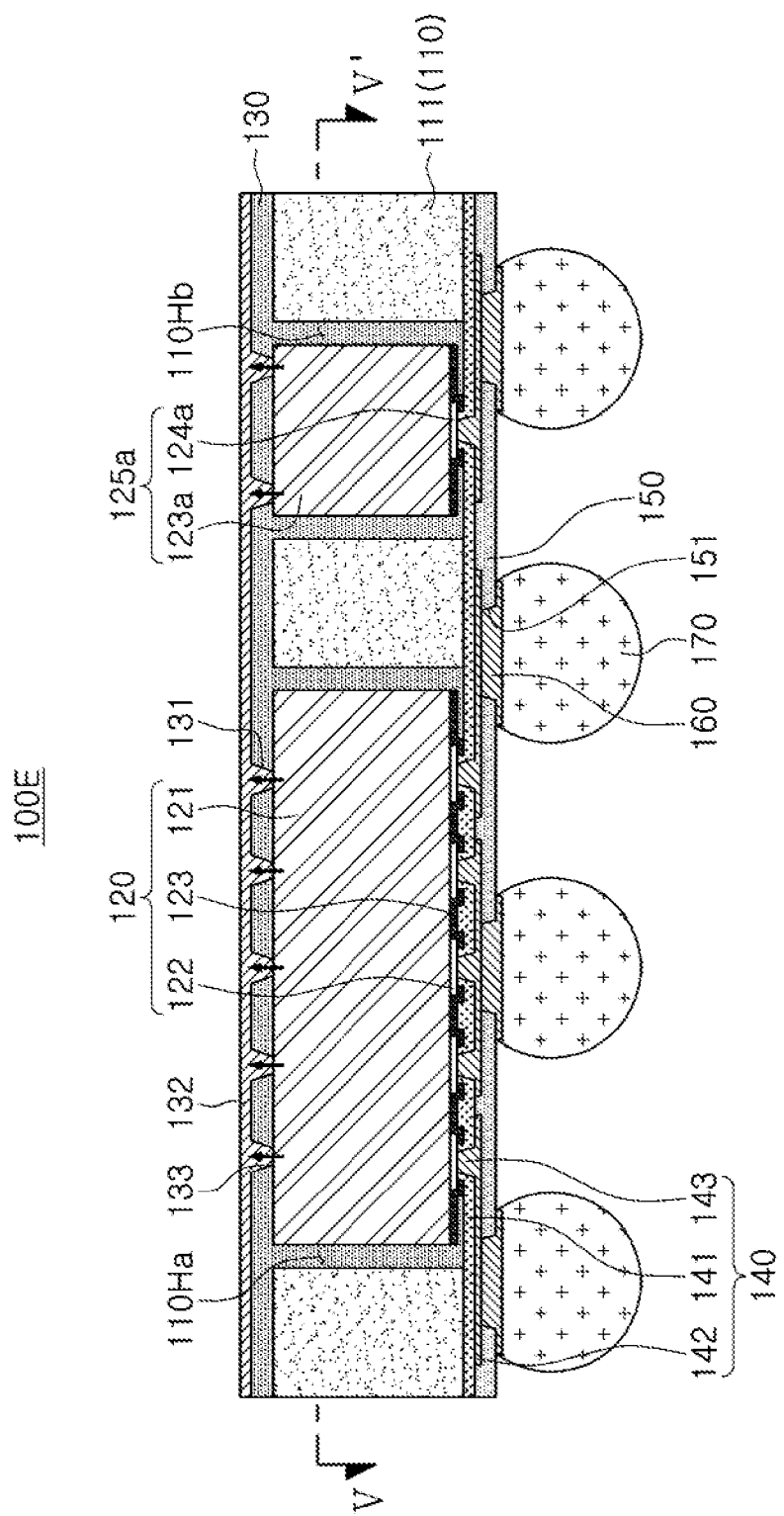
FIG. 17 is a schematic cross-sectional view illustrating another example of a fan-out semiconductor package.

FIG. 17 is a schematic cross-sectional view illustrating another example of a fan-out semiconductor package.

Figure 18:
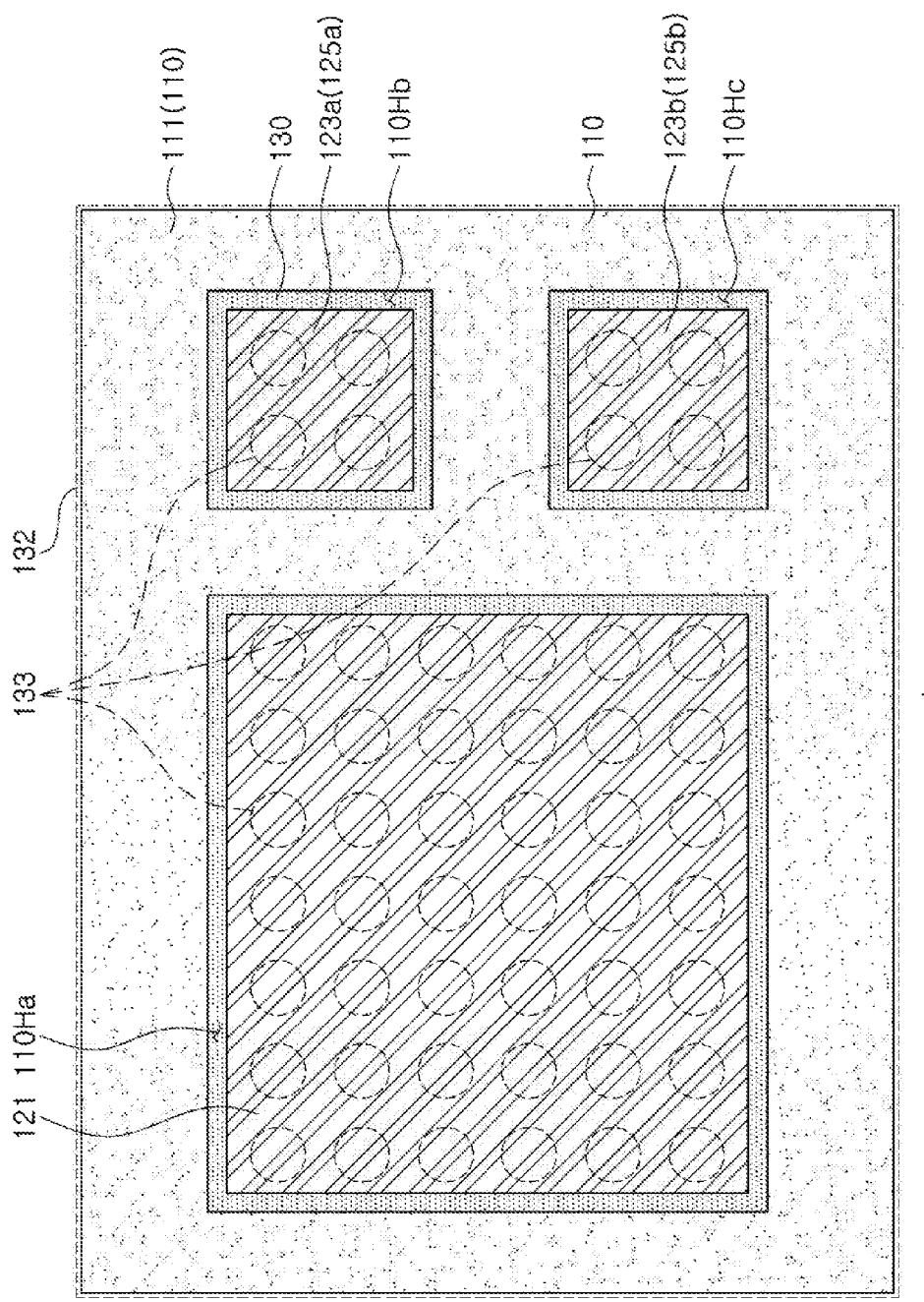
FIG. 18 is a schematic plan view taken along line V-V' of the fan-out semiconductor package of FIG. 17.

FIG. 18 is a schematic plan view taken along line V-V' of the fan-out semiconductor package of FIG. 17.

Referring to the drawings, a fan-out semiconductor package 100E according to another exemplary embodiment may include a plurality of through-holes 110Ha, 110Hb, and 110Hc, and may include a plurality of semiconductor chips 120, 125a, and 125b disposed, respectively, in the plurality of through-holes 110Ha, 110Hb, and 110Hc. The additionally disposed semiconductor chips 125a and 125b may be integrated circuits that are the same as or different from each other, including bodies 123a and 123b and connection pads 124a and 124b, respectively. The connection pad 124a and the connection pad (not illustrated) of the semiconductor chip 125a and the semiconductor chip 125b may also be electrically connected to a second connection member 140. If necessary, vias 133 may be selectively connected to only certain semiconductor chips generating a large amount of heat or may be intensively formed only in generating a large amount of heat among the semiconductor chips 120. Other contents overlap those described above, and a detailed description thereof is thus omitted.

Figure 19:
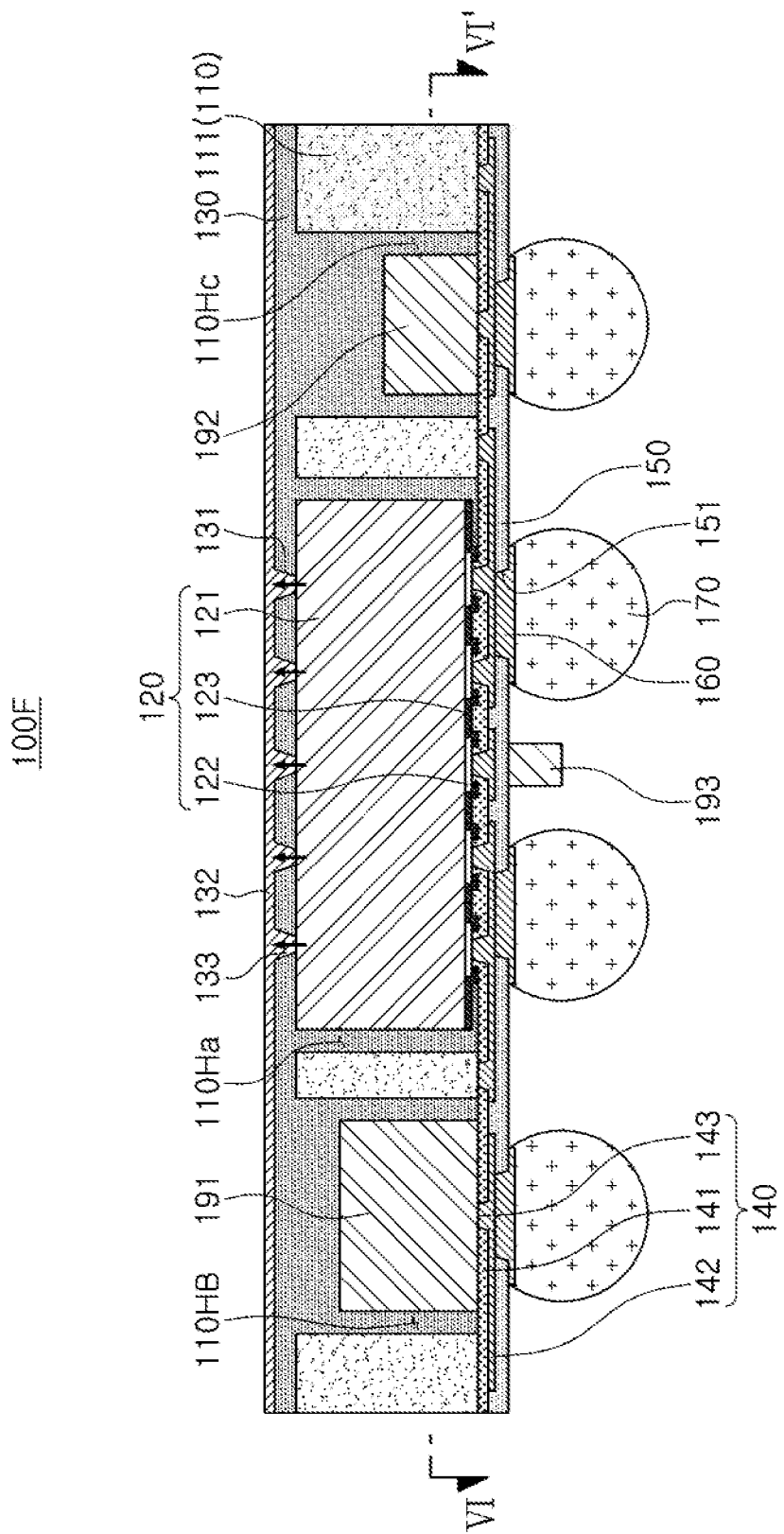
FIG. 19 is a schematic cross-sectional view illustrating another example of a fan-out semiconductor package.

FIG. 19 is a schematic cross-sectional view illustrating another example of a fan-out semiconductor package.

Figure 20:
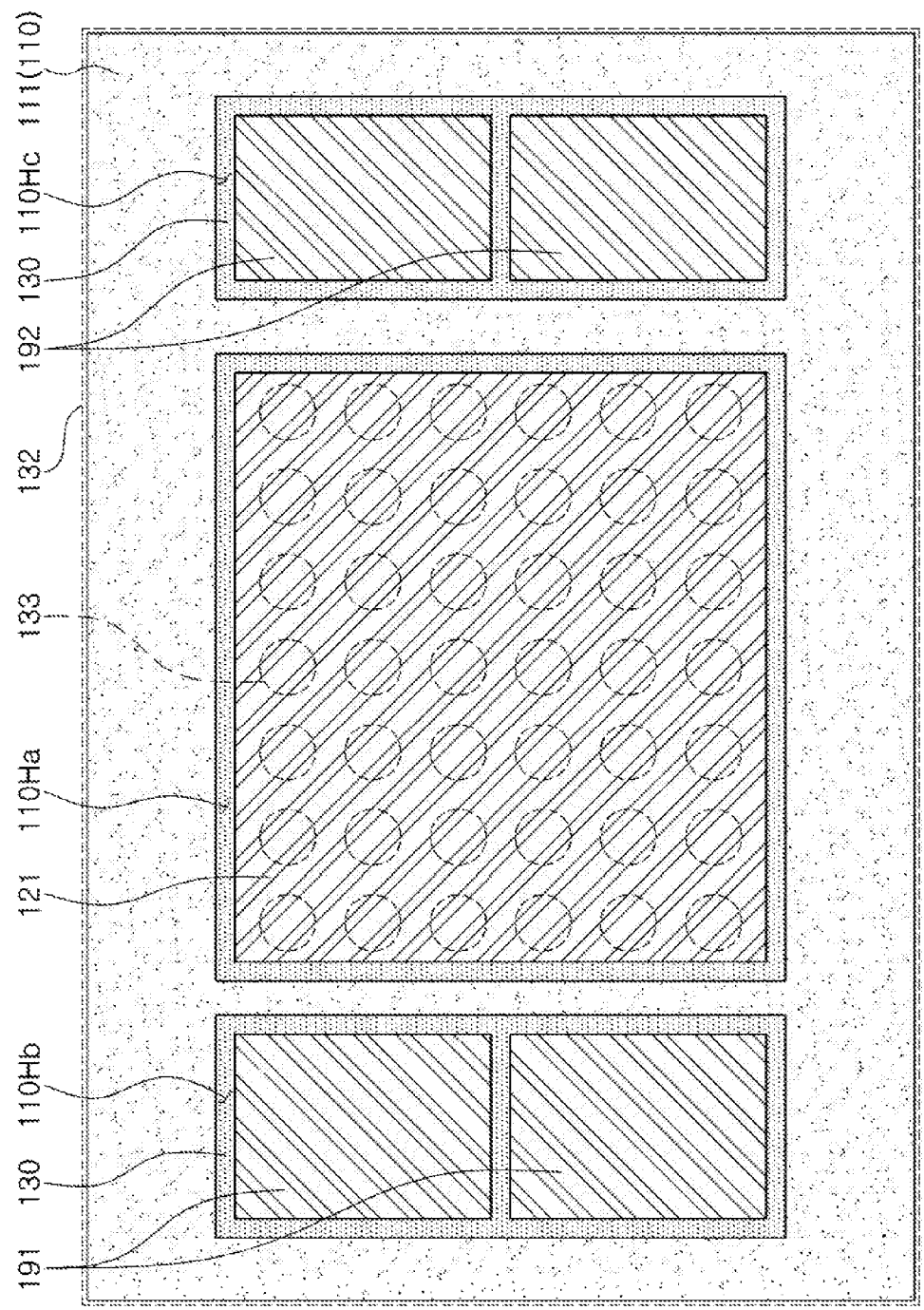
FIG. 20 is a schematic plan view taken along line VI-VI' of the fan-out semiconductor package of FIG. 19.

FIG. 20 is a schematic plan view taken along line VI-VI' of the fan-out semiconductor package of FIG. 19.

Referring to the drawings, a fan-out semiconductor package 100F according to another exemplary embodiment may include a plurality of through-holes 110Ha, 110Hb, and 110Hc, and may include a semiconductor chip 120 and passive components 191 and 192 disposed, respectively, in the plurality of through-holes 110Ha, 110Hb, and 110Hc. The passive components 191 and 192 may be, for example, capacitors, inductors, or the like, that are the same as or different from each other, but are not limited thereto. Meanwhile, vias 133 may be selectively formed to be connected to only the semiconductor chip 120. A surface mounted passive component 193 may be further disposed on a passivation layer 150, if necessary. The surface mounted passive component 193 may also be, for example, a capacitor, an inductor, or the like, but is not limited thereto. In some cases, all of the passive components 191, 192, and 193 may be capacitors, and may be connected to the same power wiring line. Other contents overlap those described above, and a detailed description thereof is thus omitted.

Figure 21:
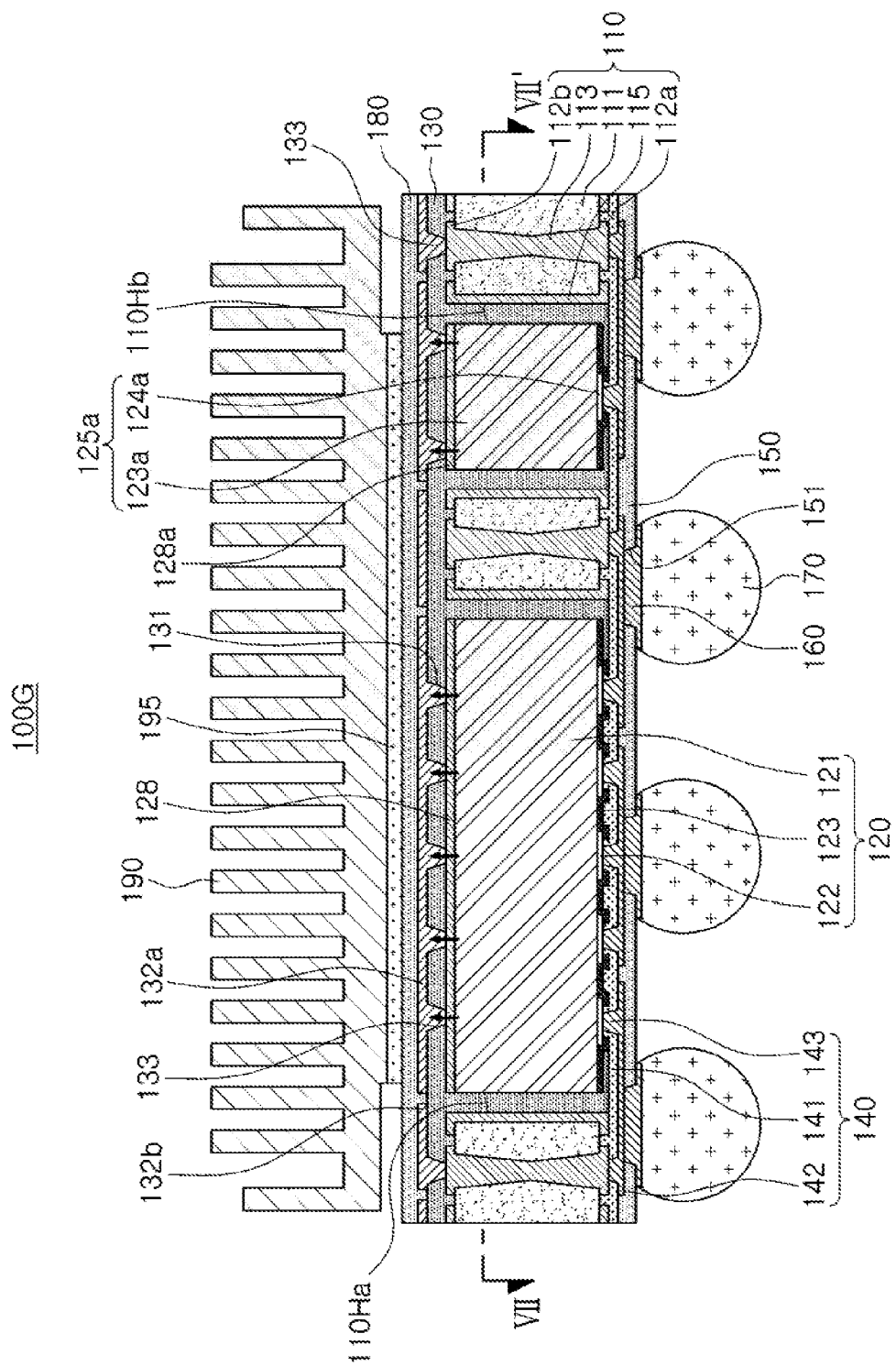
FIG. 21 is a schematic cross-sectional view illustrating another example of a fan-out semiconductor package.

FIG. 21 is a schematic cross-sectional view illustrating another example of a fan-out semiconductor package.

Figure 22:
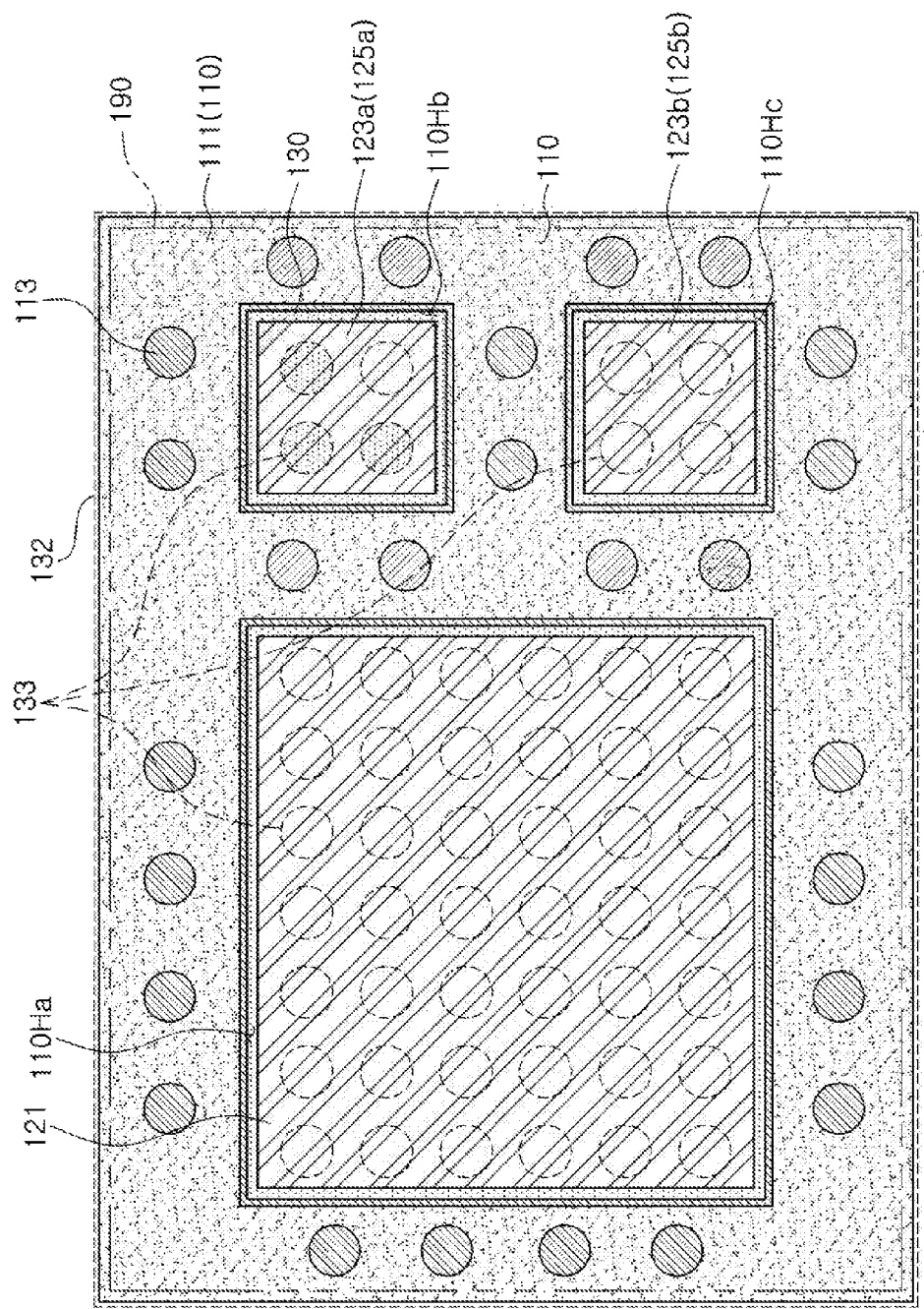
FIG. 22 is a schematic plan view taken along line VII-VII' of the fan-out semiconductor package of FIG. 21.

FIG. 22 is a schematic plan view taken along line VII-VII' of the fan-out semiconductor package of FIG. 21.

Referring to the drawings, a fan-out semiconductor package 100G according to another exemplary embodiment may include a plurality of through-holes 110Ha, 110Hb, and 110Hc, and may include semiconductor chips 120, 125a, and 125b disposed, respectively, in the plurality of through-holes 110Ha, 110Hb, and 110Hc. The semiconductor chips 120, 125a, and 125b may have, respectively, a metal layer 128, a metal layer 128a, and a metal layer (not illustrated) disposed on inactive surfaces thereof, and vias 133 may be connected to the metal layer 128, the metal layer 128a, and the metal layer (not illustrated). In addition, pattern layers 132a and 132b may include heat dissipation patterns 132a covering at least portions of an encapsulant 130 adjacent to the inactive surface of each of the semiconductor chips 120, 125a, and 125b, and may include wiring patterns 132b redistributing connection pads 122, connection pads 124a, and connection pads (not illustrated) of the semiconductor chips 120, 125a, and 125b. In addition, a first connection member 110 may include redistribution layers 112a and 112b disposed, respectively, on upper and lower surfaces of an insulating layer 111 to be disconnected from a metal layer 115, and the redistribution layers 112a and 112b may be electrically connected to each other by vias 113 penetrating through the insulating layer 111. In addition, a passivation layer 180 covering at least portions of the pattern layers 132a and 132b may be disposed on the encapsulant 130, and a heat dissipation member 190 may be attached to the passivation layer 180. Meanwhile, the heat dissipation member 190 may be attached directly to the passivation layer 180 or may be attached to the passivation layer 180 through a connection member 195 in order to improve reliability. Other contents overlap those described above, and a detailed description thereof is thus omitted.

Figure 23:
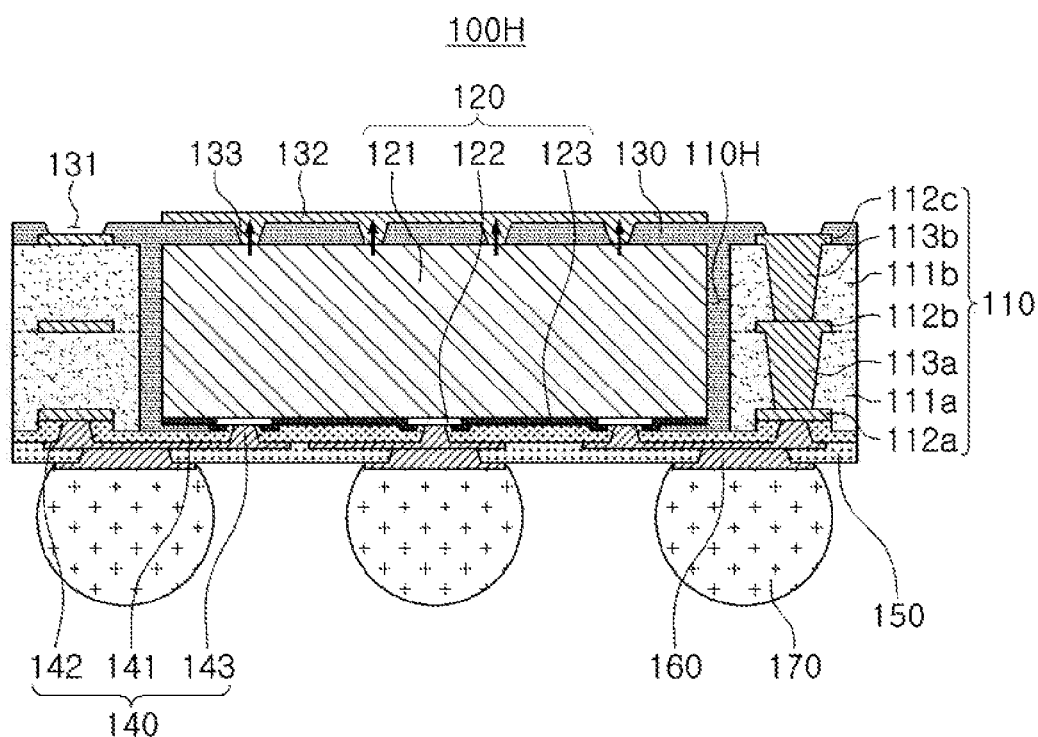
FIG. 23 is a schematic cross-sectional view illustrating another example of a fan-out semiconductor package.

FIG. 23 is a schematic cross-sectional view illustrating another example of a fan-out semiconductor package.

Referring to the drawing, in a fan-out semiconductor package 100H according to another exemplary embodiment in the present disclosure, a first connection member 110 may include a first insulating layer 111a in contact with a second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, the first and second redistribution layers 112a and 112b may be electrically connected to each other through a first via 113a penetrating through the first insulating layer 111a, and the second and third redistribution layers 112b and 112c may be electrically connected to each other through second via 113b penetrating through the second insulating layer 111b.

Since the first redistribution layer 112a is embedded, an insulating distance of an insulating layer 141 of the second connection member 140 may be substantially constant, as described above. Since the first connection member 110 may include a large number of redistribution layers 112a, 112b, and 112c, the second connection member 140 may be simplified. Therefore, a decrease in a yield depending on a defect occurring in a process of forming the second connection member 140 may be improved. The first redistribution layer 112a may be recessed into the first insulating layer 111a, such that a lower surface of the first insulating layer 111a and a lower surface of the first redistribution layer 112a have a step therebetween. Resultantly, when an encapsulant 130 is formed, a phenomenon in which a material of the encapsulant 130 bleeds to pollute the first redistribution layer 112a may be prevented.

The lower surface of the first redistribution layer 112a of the first connection member 110 may be disposed on a level above a lower surface of the connection pads 122 of the semiconductor chip 120. In addition, a distance between a redistribution layer 142 of the second connection member 140 and the first redistribution layer 112a of the first connection member 110 may be greater than that between the redistribution layer 142 of the second connection member 140 and the connection pads 122 of the semiconductor chip 120. The reason is that the first redistribution layer 112a may be recessed into the insulating layer 111. The second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed to have large sizes depending on a scale of the first connection member 110. On the other hand, the redistribution layer 142 of the second connection member 140 may be formed at a relatively small size for thinness.

Other contents overlap those described above, and a detailed description thereof is thus omitted. Meanwhile, the descriptions of the fan-out semiconductor packages 100B to 100G described above may also be applied to the fan-out semiconductor package 100H.

Figure 24:
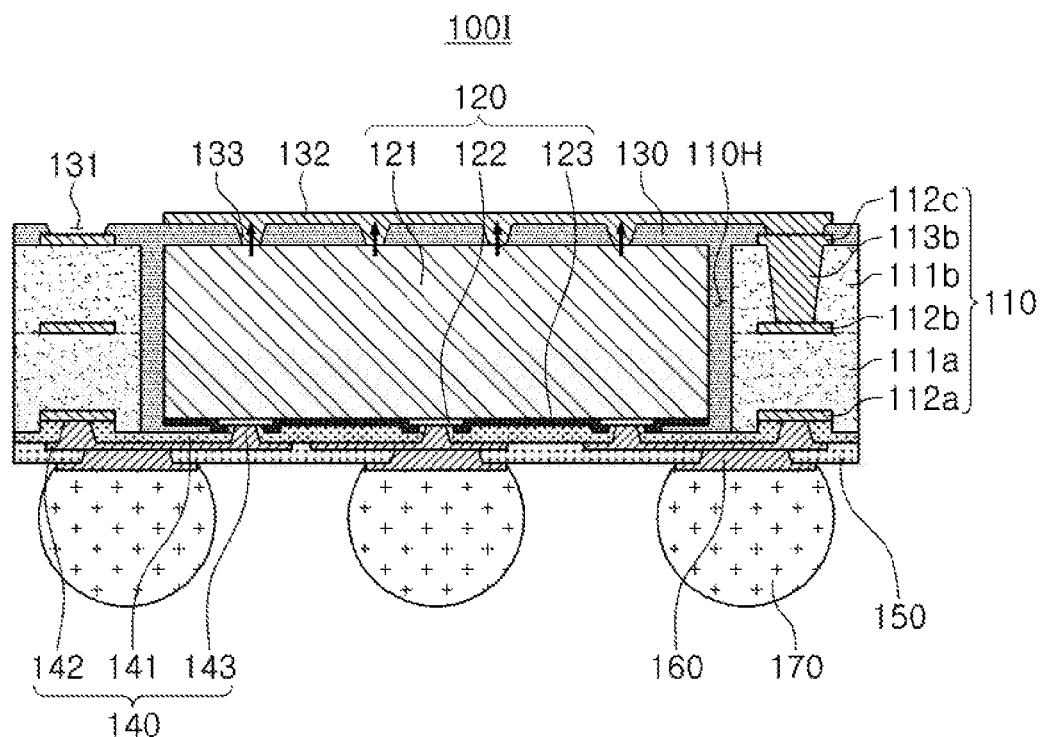
FIG. 24 is a schematic cross-sectional view illustrating another example of a fan-out semiconductor package.

FIG. 24 is a schematic cross-sectional view illustrating another example of a fan-out semiconductor package.

Referring to the drawings, in a fan-out semiconductor package 100I according to another exemplary embodiment, a pattern layer 132 may extend to at least portions of a region of an encapsulant 130 covering a first connection member 110. In addition, the pattern layer 132 may be connected to the first connection member 110 by vias 133 penetrating through the encapsulant 130 and connected to the first connection member 110. For example, the pattern layer 132 may be connected to a third redistribution layer 112c of the first connection member 110. The redistribution layer of the first connection member 110 electrically connected to the pattern layer 132 may be a ground pattern. That is, the pattern layer 132 may be connected to the ground pattern of the first connection member 110. In this case, heat may also be dissipated downwardly through the first connection member 110, such that a heat dissipation effect may be more excellent. A case in which only first and third redistribution layers 112a and 112c of the first connection member 110 have ground patterns electrically connected to the pattern layer 132 is illustrated in the drawing, but in some cases, a second redistribution layer 112b of the first connection member 110 may also have a ground pattern electrically connected to the pattern layer 132 through a first via 113a. In addition, in some cases, only the third redistribution layer 112c may also have a ground pattern electrically connected to the pattern layer 132.

Other contents overlap those described above, and a detailed description thereof is thus omitted. The descriptions of the fan-out semiconductor packages 100B to 100G described above may also be applied to the fan-out semiconductor package 100I.

Figure 25:
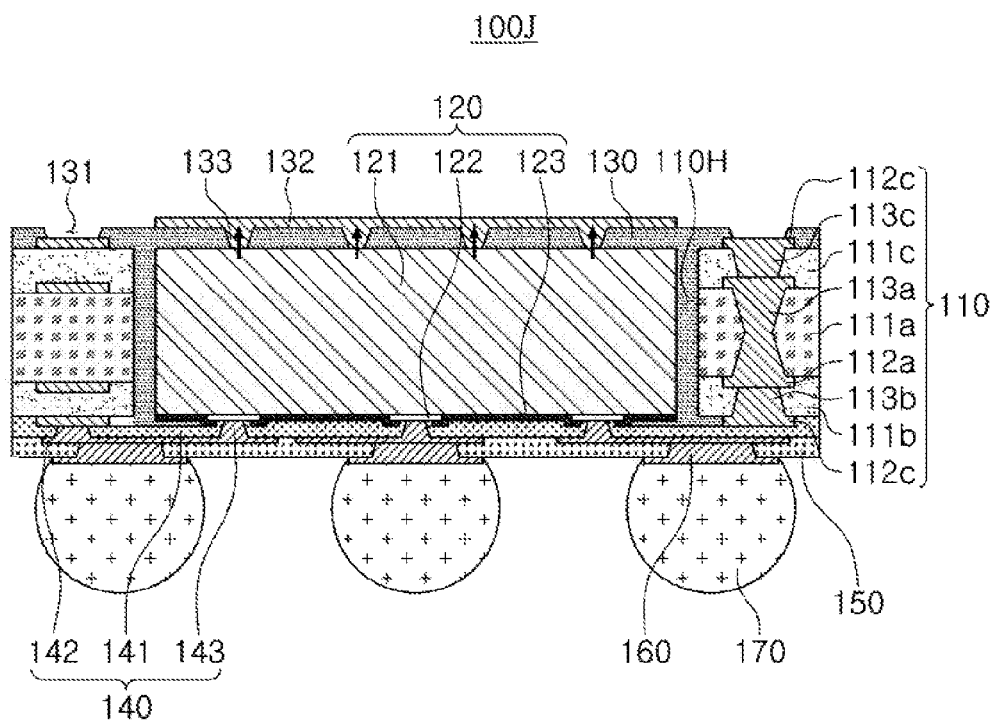
FIG. 25 is a schematic cross-sectional view illustrating another example of a fan-out semiconductor package.

FIG. 25 is a schematic cross-sectional view illustrating another example of a fan-out semiconductor package.

Referring to the drawing, in a fan-out semiconductor package 100J according to another exemplary embodiment in the present disclosure, a first connection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, the second connection member 140 may be further simplified. Therefore, a decrease in a yield depending on a defect occurring in a process of forming the second connection member 140 may be improved. Meanwhile, the first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first connection member 110 may be disposed on a level below a lower surface of the connection pads 122 of the semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pads 122 of the semiconductor chip 120. The reason is that the third redistribution layer 112c may be disposed in a protruding form on the second insulating layer 111b, resulting in contact with the second connection member 140. The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layer 142 of the second connection member 140 may be formed at a relatively small size for thinness.

Other contents overlap those described above, and a detailed description thereof is thus omitted. Meanwhile, the descriptions of the fan-out semiconductor packages 100B to 100G described above may also be applied to the fan-out semiconductor package 100J.

Figure 26:
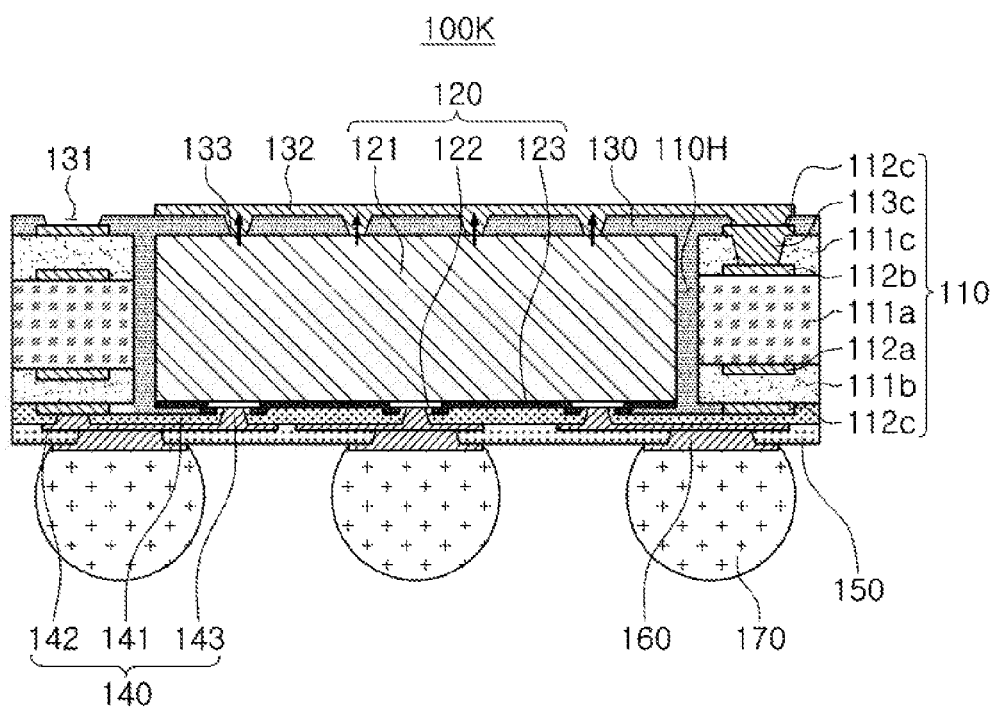
FIG. 26 is a schematic cross-sectional view illustrating another example of a fan-out semiconductor package.

FIG. 26 is a schematic cross-sectional view illustrating another example of a fan-out semiconductor package.

Referring to the drawings, in a fan-out semiconductor package 100K according to another exemplary embodiment, a pattern layer 132 may extend to at least portions of a region of an encapsulant 130 covering a first connection member 110. In addition, the pattern layer 132 may be connected to the first connection member 110 by vias 133 penetrating through the encapsulant 130 and connected to the first connection member 110. For example, the pattern layer 132 may be connected to a fourth redistribution layer 112d of the first connection member 110. The redistribution layer of the first connection member 110 electrically connected to the pattern layer 132 may be a ground pattern. That is, the pattern layer 132 may be connected to the ground pattern of the first connection member 110. In this case, heat may also be dissipated downwardly through the first connection member 110, such that a heat dissipation effect may be more excellent. A case in which only second and fourth redistribution layers 112b and 112d of the first connection member 110 have ground patterns electrically connected to the pattern layer 132 is illustrated in the drawing, but in some cases, a first redistribution layer 112a and/or a third redistribution layer 112c of the first connection member 110 may also have ground patterns electrically connected to the pattern layer 132 through a first via 113a and/or a second via 113b. In addition, in some cases, only the fourth redistribution layer 112d may also have a ground pattern electrically connected to the pattern layer 132.

Other contents overlap those described above, and a detailed description thereof is thus omitted. The descriptions of the fan-out semiconductor packages 100B to 100G described above may also be applied to the fan-out semiconductor package 100K.

As set forth above, according to the exemplary embodiment in the present disclosure, a fan-out semiconductor package in which heat generated by a semiconductor chip may be effectively dissipated by a simple process may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating at least portions of the first connection member and the inactive surface of the semiconductor chip;
a pattern layer disposed on the encapsulant and covering at least portions of the encapsulant adjacent to the inactive surface of the semiconductor chip;
vias penetrating through the encapsulant and connecting the pattern layer and the inactive surface of the semiconductor chip to each other; and
a second connection member disposed on the first connection member and the active surface of the semiconductor chip and including a redistribution layer electrically connected to the connection pads of the semiconductor chip,
wherein the first connection member includes a first insulating layer, a first redistribution layer in contact with the second connection member and embedded in the first insulating layer, and a second redistribution layer disposed on the other surface of the first insulating layer opposing one surface of the first insulating layer in which the first redistribution layer is embedded, and the first and second redistribution layers are electrically connected to the connection pads.

2. The fan-out semiconductor package of claim 1, wherein the pattern layer and the vias are integrated with each other without a boundary therebetween.

3. The fan-out semiconductor package of claim 1, further comprising a metal layer disposed on the inactive surface of the semiconductor chip,
wherein the vias contact the metal layer.

4. The fan-out semiconductor package of claim 1, further comprising:
a passivation layer covering at least portions of the pattern layer; and
a heat dissipation member attached to the passivation layer.

5. The fan-out semiconductor package of claim 1, wherein the pattern layer includes patterns electrically insulated from the connection pads of the semiconductor chip.

6. The fan-out semiconductor package of claim 1, wherein the pattern layer includes a ground pattern.

7. The fan-out semiconductor package of claim 6, wherein the pattern layer further includes a signal pattern.

8. The fan-out semiconductor package of claim 7, wherein the first connection member includes a ground pattern, and
the ground pattern of the pattern layer is electrically connected to the ground pattern of the first connection member through the vias.

9. The fan-out semiconductor package of claim 1, wherein the first connection member includes a redistribution layer of which at least portions are exposed by openings penetrating through the encapsulant, and
the redistribution layer of the first connection member is electrically connected to the connection pads.

10. The fan-out semiconductor package of claim 1, further comprising a metal layer disposed on a wall of the through-hole.

11. The fan-out semiconductor package of claim 10, wherein the metal layer extends to an upper portion and a lower portion of the first connection member.

12. The fan-out semiconductor package of claim 1, wherein the first connection member includes first and second through-holes as the through-hole,
the semiconductor chip is disposed in the first through-hole,
a passive component is disposed in the second through-hole, and
the vias are selectively connected to the inactive surface of the semiconductor chip.

13. The fan-out semiconductor package of claim 1, wherein the first connection member further includes a second insulating layer disposed on the first insulating layer and covering the second redistribution layer and a third redistribution layer disposed on the second insulating layer, and
the third redistribution layer is electrically connected to the connection pads.

14. The fan-out semiconductor package of claim 1, wherein a lower surface of the first redistribution layer and a lower surface of the first insulating layer have a step therebetween.

15. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating at least portions of the first connection member and the inactive surface of the semiconductor chip;
a pattern layer disposed on the encapsulant and covering at least portions of the encapsulant adjacent to the inactive surface of the semiconductor chip;
vias penetrating through the encapsulant and connecting the pattern layer and the inactive surface of the semiconductor chip to each other; and
a second connection member disposed on the first connection member and the active surface of the semiconductor chip and including a redistribution layer electrically connected to the connection pads of the semiconductor chip,
wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and
the first to third redistribution layers are electrically connected to the connection pads.

16. The fan-out semiconductor package of claim 15, wherein the first connection member further includes a third insulating layer disposed on the first insulating layer and covering the second redistribution layer and a fourth redistribution layer disposed on the third insulating layer, and
the fourth redistribution layer is electrically connected to the connection pads.

17. The fan-out semiconductor package of claim 15, wherein the first insulating layer has a thickness greater than that of the second insulating layer.

18. The fan-out semiconductor package of claim 1, wherein the pattern layer and the vias have thermal conductivity greater than that of the encapsulant.

* * * * *